United States Patent [19]
Sato et al.

[11] Patent Number: 5,511,087
[45] Date of Patent: Apr. 23, 1996

[54] METHOD AND DEVICE FOR CONTROLLING SEMICONDUCTOR LASER

[75] Inventors: Shinichi Sato; Munenori Ohtsuki; Isao Iwaguchi; Ichiro Shinoda, all of Kawasaki, Japan

[73] Assignee: Fujitsu Limited, Kawasaki, Japan

[21] Appl. No.: 113,109

[22] Filed: Aug. 30, 1993

[30] Foreign Application Priority Data

Mar. 19, 1993 [JP] Japan .................................. 5-060732

[51] Int. Cl.⁶ ................................................ H01S 3/10
[52] U.S. Cl. .................... 372/38; 372/29; 372/31
[58] Field of Search ................... 272/29, 31, 38

[56] References Cited

U.S. PATENT DOCUMENTS 5,253,267  10/1993  Johnson ..................................... 372/38
5,309,458  5/1994  Carl ........................................... 372/34

Primary Examiner—Rodney B. Bovernick
Assistant Examiner—Yisun Song
Attorney, Agent, or Firm—Staas & Halsey

[57] ABSTRACT

The present invention relates to a semiconductor laser control method used preferably for a reading control system such as a bar code reading device and to a semiconductor laser control device employing the above method. The object of the invention is to provide a semiconductor laser control device which can be controlled based on the output of a semiconductor laser, provides a stable laser output in a noise environment, enables easy output adjustment, and is immune to external thermal or electrical noises. In the semiconductor laser control method where the light amount of a light amount to current controllable semiconductor laser is subjected to a feedback control with a predetermined time constant while it is monitored, when the light amount is less than a predetermined value, the semiconductor laser is subjected to an feedback control with a first time constant. When the light amount is more than a predetermined value, the semiconductor laser is subjected to a feedback control with a second time constant.

25 Claims, 28 Drawing Sheets

METHOD AND DEVICE FOR CONTROLLING SEMICONDUCTOR LASER

BACKGROUND OF THE INVENTION

1. Field of the Invention

The present invention relates to a semiconductor laser control method and a semiconductor laser control device preferably used for a reading control system such as a bar code reading device.

2. Description of the Related Art

In recent years, bar codes have been extensively utilized typically in POS (point of sales) system in the distribution industry. Such a circumstance demands a small, low price, low power consumption bar code reading device. In order to answer such needs, semiconductor lasers have been used in place of conventional gas lasers.

FIG. 23 is a structural block diagram showing a bar code reading device in which a semiconductor laser control device is used in the optical system. In FIG. 23, numeral 1 represents a bar code printed on a surface of an article. The bar code 1 is formed of black bars and white bars arranged alternately and indicates specific datum based on the widths thereof.

The optical system 2 irradiates a laser beam L2 to the bar-code and receives the laser beam R1 reflected from the bar-code 1. The optical system 2 also is formed of a semiconductor laser control device (laser emitter) 3, a scanning mechanism 4, and a photoelectric converter 5.

When the semiconductor laser control device 3 is activated under the control of a CPU, it amplifies the laser output based on a predetermined time constant and holds automatically its light amount at a predetermined value.

As shown in FIG. 24, the semiconductor laser control device 3 is constituted of a laser diode chip (LD chip) 30, a transistor 31, an analog switch (SW) 34, operational amplifiers 36 and 38, a reference voltage source 42, a capacitor 35, a variable resistor 37, and resistors 32, 33, and 46. The LC chip 30 is formed of a laser diode (LD) 11 as a semiconductor laser, and a photo diode 12.

In such a circuit configuration, an external photo diode 12 detects a current Im showing a laser light amount. As shown in FIG. 25, the operational amplifier 36 operates so as to equalize the voltage Va with a reference voltage Vref so that the LD drive current Iop from the semiconductor laser is subjected to a feedback control to maintain the laser light amount at a constant value.

In the operation, as shown by numerals (1) and (2) in FIGS. 25, when the analog switch 34 is turned off (see time a) in response to a control signal from the CPU, the variable resistor 37 converts the monitoring current Im as the detected laser light amount into a voltage Va corresponding to a predetermined light amount.

The voltage $V_A$ (or $V_{A1}$) is compared with the reference voltage Vref and is integrated by the operational amplifier 36 so that the output voltage $V_B$ of the operational amplifier 36, as shown in FIG. 25, rises, for example, in accordance with a time constant of TcmV/sec from the reference voltage Vref. Then the output voltage $V_B$ of the amplifier 36 is converted into an LD drive current Iop by the transistor 31.

When the voltage Va exceeds a threshold voltage after a period b of time, or the LD drive current Iop exceeds a threshold current value of the laser diode 11, the laser diode 11 starts its laser oscillation.

Then the current Im from the external photo diode 12 increases proportionally to the light amount while the voltage $V_A$ inputted to the negative input of the operational amplifier 38 increases during a period from the time b to the time c as shown in FIG. 25.

The output of the operational amplifier 36 is increased till the voltage $V_A$ is equalized with the reference voltage Vref. The operational amplifier 36 equalizes the voltage $V_B$ with the reference voltage Vref so as to maintain the output voltage $V_B$ at a fixed value.

As a result, since the signal current sent to the base of the transistor 31 is at a fixed value, the LD drive current Iop is maintained at a fixed value, thus maintaining a laser output of the laser diode 11 at a predetermined value. The voltage changing rate depends on the reference voltage Vref, the capacitor 35, and the resistor 46.

When the voltage reaches a predetermined value, the operational amplifier 36 compensates variations in laser output variations due to various factors with the time constant so as to maintain the predetermined value. When the analog switch 34 is turned on in response to the control signal from the CPU, the operational amplifier 36 provides the output at the reference voltage Vref so that the transistor 31 is turned off to stop the laser oscillation.

The LD drive current Iop of the laser diode 11 is increased in accordance with the time constant because an abrupt LD drive current Iop producing a predetermined light amount (after the time c in FIG. 25) may destroy the laser diode 11.

FIG. 26 shows a modified semiconductor laser control device 3A. In the semiconductor laser control device 3A, resistors 62 and 63 are connected to the negative input of the forgoing semiconductor laser control device. A resistor 61 is added instead of the variable resistor 37 and a variable resistor 25 is inserted between the resistor 46 and the operational amplifier 38.

The arrangement of the resistors 61, 62, and 63 converts the current Im inputted to the positive and negative inputs of the operational amplifier 38 into a voltage with a predetermined ratio. The arrangement allows the variable resistor 25 to arrange to the output of the operational amplifier 38 and to divide the voltage at the output of the operational amplifier 38. Other configuration is similar to those in the semiconductor laser control device 3.

In the semiconductor laser control devices 3 and 3A, the reason that the variable resistors 37 and 25 are connected to the positive terminal of the operational amplifier 38 and the input of the resistor 46 will be explain ed below.

As shown in FIG. 27, even if the laser diode 11 and the external diode 12 used in the LD chip 30 are made of the same kind, the mounting condition may cause variations several times in the monitoring current Im of the laser diode 11 under the same light amount. For that reason, a proper negative input of the operational amplifier 36 may not be established with respect to light amount. However, the voltage division due to the above layout of the variable resistor allows the voltage sent to the operational amplifier 36 to adjust at a proper value.

FIG. 27 shows the relationship between the voltage division ratio K and the current Im at the optical amount P5 of 5 mW. The scale of the voltage division ratio K is proportional to the angle of the resistance varying knob of a variable resistor. As shown by the light amount over the range between 2 mW to 4 mW in FIG. 27, the more the current Im increases, the more the range between 2 mW and 4 mW narrows. There are the relations of the current Im=(light amount P0)×(light amount P5)/5 mW, the voltage Vm=(current Im)×(resistance value of the resistor 61), and K=(reference voltage Vref)÷(voltage Vm), where light amount P0 is a light amount value varied with a voltage division ratio K with respect to a specific current Im.

In some cases, as shown in FIG. 28, a metal heat sink 28 is directly and electrically contacted to the LD chip 30 to dissipate the heat generated from it.

The scanning mechanism 4, shown in FIG. 23, is formed of a polygon mirror driven rotatably by, for example, a motor, and reflects the laser beam L1 from the laser emitting unit 3. The laser beam L1 irradiates as a laser beam L2 to the bar code 1 including black bars and white bars and moves and scans at a fixed rate and perpendicularly to the bar code 1.

The scanning mechanism 4 irradiates the reflected light R1 as the reflected light R2 to the photoelectric converting unit 5 while the reflected light R1 moves with the scanning of the laser beam L2.

Furthermore, the photoelectric converting unit 5 is formed of an photoelectric element such as a photo diode, and converts the reflected light (optical input signal) R2 received via the scanning mechanism 4 into an electric signal (analog value) corresponding to the light amount.

Numeral 6 represents an a/d converter for converting an electric signal from the photoelectric converting unit 5 to a digital signal. The aid converter 6 also converts a binary signal including a black level signal corresponding to the black bar portion of the bar code 1 and a white level signal corresponding to the white bar portion thereof by converting an electric signal from the photoelectric converting unit 5 in a digital form. In the binary signal, since the light amount of the light reflected from the white bar portion is larger than that from the black bar portion, the white level signal is obtained as a high level signal and the black level signal is obtained as a low level signal.

Numeral 7 represents a bar width counter for counting the clock signal from the clock generator 8. The bar width counter 7 outputs the time widths of the black level signal portion and the white level signal portion from the a/d counter 6 or values corresponding to the black bar width and the white bar width of an actual bar code 1, as a counted value of the clock signal.

Numeral 9 represents a memory for storing a bar counted value from the bar width counter 7 and 10 represents a CPU. The CPU 10 extracts and demodulates specific data of the bar code 1 based on the bar width counted values (values corresponding to the each black bar width and each white bar width) stored in the memory 9.

In the above structure, the laser beam L1 emitted from the laser emitting unit 3 is irradiated as the laser beam L2 to the black bar and the white bar of the bar code 1 by the scanning mechanism 4, and is moved and scanned at a fixed rate and perpendicularly to the black bar and the white bar thereof.

The laser beam L2 from the scanning mechanism 4 is scattered and reflected by the bar code 1 and reentered as a light R1 reflected back to the scanning mechanism 4. The reflected light R1 moves at the scanning rate of the laser beam L2 while the reflection angle varies. When the reflected light R1 is reflected on the polygon mirror forming the scanning mechanism 4, it enters onto the photoelectric element of the photoelectric converting unit 5 arranged at a predetermined place as the reflection light R2.

The photoelectric converting unit 5 converts the reflected light R2 into an electric signal corresponding to the light amount thereof. The a/d converter 6 converts the electric signal to a signal in a digital form or a binary signal having a black level signal corresponding to a black bar portion in a bar code 1 and a white level signal corresponding to a white bar portion therein.

Then the bar width counter 7 counts the clock signals from the clock generator 8 and measures the time widths (values corresponding to the widths of a black bar and a white bar of an actual bar code 1) of the black level signal portion and the white level signal portion of a binary signal from the aid converter 6, and stores the counted value of the clock signals temporarily into the memory 9. The CPU 10 subjects the bar width count value stored in the memory 9 to a specific demodulation process to extract and demodulate specific data from the bar code 1.

However, the semiconductor laser controller used for the above bar code reader cannot obtain the normal feedback current and voltage if noise due to a factor is induced in the feedback system when the laser diode emits properly a light beam of a predetermined light amount.

Thus the operational amplifier varies the output with a given time constant or the time constant ranging from an emitting time to the time to a predetermined light amount even if the voltage is enough to establish a predetermined light amount. However, there is a disadvantage in that since this time constant provides an excessive varying rate, the laser diode emits abnormally before the feedback system in abnormal state is detected.

Furthermore, there is a disadvantage in that the laser output is not stabilized at a predetermined light amount because the above time constant varies largely when the laser output is compensated to a predetermined light amount.

As shown in FIG. 27, when the current to a light amount is large, the scale in light amount is narrowed. Hence the voltage division ratio K between 0.82 to 0.42 can be easily adjusted by a variable resistor. However, when the ratio is less than 0.42, the light amount adjusting becomes difficult because the light amount varies coarsely at a slight variation in angle of the knob of the variable resistor. A heat sink mounted on a LD chip may conduct an undesired current through the LD chip 30 because the heat sink in a shape provides an antenna effect to an electromagnetic wave and electrostatic electricity. As a result, there is a disadvantage in that the operational life of the laser diode in the LD chip and an external photo diode becomes short.

SUMMARY OF THE INVENTION

The present invention is made to overcome the above mentioned problems. An object of the present invention is to provide a semiconductor laser control device which can operate normally without being affected by any noise in the feedback system for a period of time taking from an emitting start time till a time reaching a predetermined light amount, and which can produce a stable laser output at all times by compensating properly the laser output of a predetermined light amount varied due to various factors. The semiconductor laser control device also can adjust a variable resistor to a proper value and can prevent a laser diode and an external photo diode in an LD chip from external thermal or electrical noises.

Another object of the present invention is to provide a method which realizes the above semiconductor laser control device.

In order to achieve the above objects, according to the present invention, a semiconductor control method wherein a light amount of a light amount to current controllable semiconductor laser is subjected to a feedback control based on a predetermined constant while said semiconductor laser is monitored, is characterized by the steps of subjecting the light amount of the semiconductor laser to a feedback control based on a first time constant when a light amount of the semiconductor laser is less than a predetermined light amount; and subjecting the light amount of the semiconductor laser a feedback control based on a second time constant when a light amount of the semiconductor laser is more than the predetermined light amount.

A semiconductor laser control device according to the present invention is characterized by a semiconductor laser permitting a light-amount control in accordance with current; light amount monitoring means for monitoring a light amount of the semiconductor laser; first feedback control means for controlling a feedback of the light amount from the semiconductor laser with a first time constant based on a monitoring result from the light monitoring means; second feedback control means for controlling a feedback of the light amount of the semiconductor laser with a second time constant based on a monitoring result from the light amount monitoring means; and control mode selecting means for selecting a control mode by the first feedback control means when a monitoring result of the light amount monitoring means is less than a predetermined light amount and for selecting a control mode by the second control feedback means when the monitoring result is more than the predetermined light amount.

Furthermore, according to the present invention, a semiconductor laser control method wherein a light amount to current controllable semiconductor laser is subjected to a light amount feedback control with a predetermined time constant while the light amount is monitored, is characterized by the steps of controlling a feedback of a light amount of the semiconductor laser with a first time constant after a predetermined lapse of time when the semiconductor laser has been changed from an on state to an off state; and controlling a feedback of a light amount of the semiconductor laser with a second time constant after the predetermined lapse of time when the semiconductor laser has been changed from an on state to an off state.

The predetermined time is set to be longer than a period of time when the semiconductor laser emits the predetermined light amount value defined by the first time constant.

A semiconductor laser control device according to the present invention is characterized by a semiconductor laser permitting a light-amount control in accordance with current; light amount monitoring means for monitoring a light amount of the semiconductor laser; first feedback control means for controlling a feedback of light amount from the semiconductor laser with a first time constant based on a monitoring result from the light amount monitoring means; second feedback control means for controlling a feedback of the light amount of the semiconductor laser with a second time constant based on a monitoring result from the light amount monitoring means; on/off control means for controlling the on/off operation of the semiconductor laser; and control mode selecting means for selecting a control mode of the first feedback control means after a predetermined period of time when the semiconductor laser has been changed from an off state to an on state by said on/off control means, and for controlling a control mode of the second feedback control means after the predetermined period of time when the semiconductor laser has been changed from an off state to an o n state.

In this case, it is preferable that the predetermined time is set to be longer than a period of time till the light amount of the semiconductor laser reaches a predetermined value based on the first time constant.

According to the present invention, a semiconductor laser control method wherein a light amount of a light amount to current controllable semiconductor laser is subjected to a feedback control based on a predetermined time constant while the semiconductor laser is monitored, is characterized by the steps of controlling a feedback of light amount of the semiconductor laser with a first time constant when a drive current of the semiconductor laser is less than a predetermined drive current; and controlling a feedback of light amount of the semiconductor laser with a second time constant when a drive current of the semiconductor laser is more than the predetermined drive current.

A semiconductor laser control device according to the present invention is characterized by a semiconductor laser permitting a light-amount control in accordance with current; light amount monitoring means for monitoring a light amount of the semiconductor laser; drive current measuring means for measuring a drive current of the semiconductor laser; first feedback control means for controlling a feedback of the light amount of the semiconductor laser with a first time constant based on a monitoring result from the light monitoring means; second feedback control means for controlling a feedback of the light amount of the semiconductor laser with a second time constant based on a monitoring result of the light amount monitoring means; and control mode selecting means for selecting a control mode of the first feedback control means when a monitoring result from said drive current measuring means is less than a predetermined drive current, and for controlling a control mode of the second feedback control means when the monitoring result from the drive current measuring means is more than the predetermined drive current.

In this case, in the method and the device according to the present invention, it is preferable that the second time constant is set so as to be longer than the first time constant.

According to the present invention, a semiconductor laser control method wherein a light amount of a light amount to current controllable semiconductor laser is subjected to a feedback control based on a predetermined constant while the semiconductor laser is monitored, is characterized by the steps of controlling a feedback of said light amount of said semiconductor laser based on a first time constant when a drive current of the semiconductor laser is less than a predetermined value; controlling a feedback of light amount of the semiconductor laser based on a second time constant when a drive current of the semiconductor laser is more than the predetermined value; and controlling a feedback of the light amount of the semiconductor laser based on a third time constant when a light amount of the semiconductor laser is more than a predetermined light amount.

In this case, it is preferable that the third time constant is longer than the second time constant, and the second time constant is longer than the first time constant.

A semiconductor laser control device is characterized by a semiconductor laser permitting a light-amount control in accordance with current; light amount monitoring means for monitoring a light amount of the semiconductor laser; drive current measuring means for measuring a drive current of the semiconductor laser; first feedback control means for controlling a feedback of the light amount of the semiconductor laser with a first time constant based on a monitoring result from the light monitoring means; second feedback control means for controlling a feedback of light amount of the semiconductor laser with a second time constant based on a monitoring result from the light amount monitoring means; third feedback control means for controlling a feedback of the light amount of the semiconductor laser with a third control time constant based on a monitoring result from the light amount monitoring means; and control mode selecting means for selecting a control mode of the first feedback control means when a drive current is less than a predetermined value based on a measuring result of the drive current measuring means and the light amount monitoring means, for selecting a control mode of the second feedback control means when a drive current is more than a predetermined value, and for selecting a control mode of the third feedback control means when a light amount is more than a predetermined value.

In this case, it is preferable that the third time constant is longer than the second time constant, and the second time constant is longer than the first time constant.

According to the present invention, a semiconductor laser control method wherein a light amount of a light amount to current controllable semiconductor laser is subjected to a feedback control based on a predetermined constant while the semiconductor laser is monitored, is characterized by the step of inputting a light amount monitoring signal to the feedback control means via a low pass filter when a light amount of the semiconductor laser is larger than a predetermined light amount.

Furthermore, a semiconductor laser control device according to the present invention is characterized by a semiconductor laser permitting a light-amount control in accordance with current; light amount monitoring means for monitoring a light amount of the semiconductor laser; feedback control means for controlling a feedback of the light amount of the semiconductor laser with a predetermined light amount based on a monitoring result from the light amount monitoring means; low pass filter for passing a low frequency component of the monitoring result from the light amount monitoring means; and selecting means for inputting the monitoring signal from the light amount monitoring means to the feedback control means through the low pass filter when a light amount is larger than a predetermined light amount based on the monitoring result from the light amount monitoring means.

According to the present invention, a semiconductor laser control method wherein a light amount of a light amount to current controllable semiconductor laser is subjected to a feedback control based on a predetermined constant while said semiconductor laser is monitored, is characterized by the step of inputting a light amount monitoring signal to the feedback control means via a low pass filter after a predetermined period of time when a light amount of the semiconductor laser is larger than a predetermined light amount.

Moreover, a semiconductor laser control device according to the present invention is characterized by a semiconductor laser permitting a light-amount control in accordance with current; light amount monitoring means for monitoring a light amount of the semiconductor laser; feedback control means for controlling a feedback of the light amount of the semiconductor laser with a predetermined light amount based on a monitoring result from the light amount monitoring means; low pass filter for passing a low frequency component of a monitoring result from the light amount monitoring means; and selecting means for inputting the monitoring signal from the light amount monitoring means to the feedback control means through the low pass filter after a predetermined period of time when a light amount is larger than a predetermined light amount based on the monitoring result from the light amount monitoring means.

According to the present invention, a semiconductor laser control method wherein a light amount of a light amount to current controllable semiconductor laser is subjected to a feedback control based on a predetermined constant while the semiconductor laser is monitored, is characterized by the step of inputting a light amount monitoring signal to the feedback control means via a low pass filter after a predetermined period of time when the semiconductor laser has been changed from an off state to an on state.

Furthermore, a semiconductor laser control device according to the present invention is characterized by a semiconductor laser permitting a light-amount control in accordance with current; light amount monitoring means for monitoring a light amount of the semiconductor laser; feedback control means for controlling a feedback of the light amount of the semiconductor laser with a predetermined light amount based on a monitoring result from the light amount monitoring means; low pass filter for passing a low frequency component of a monitoring result from the light amount monitoring means; on/off control means for controlling the on/off operation of the semiconductor laser; and selecting means for inputting a monitoring signal from the light amount monitoring means to the feedback control means via the low pass filter after a predetermined period of time when the semiconductor laser has been changed from an off state to an on state by the on/off control means.

A semiconductor laser control device according to the present invention is characterized by a semiconductor laser permitting a light-amount control in accordance with current; light amount monitoring means for monitoring a light amount of the semiconductor laser as a current value; a current to voltage converter for converting a monitoring current from the light amount monitoring means into a voltage value; monitoring voltage dividing means having two resistors serially connected to each other to divide a monitoring voltage converted by the current to voltage converter; feedback control means for controlling a feedback of the light amount of the semiconductor laser so as to equalize the monitoring voltage from said monitoring voltage dividing means to a reference voltage; and a switch for short-circuiting one resistor in the monitoring voltage dividing means to change the voltage division ratio.

In this case, the monitoring voltage dividing means is constituted of a variable resistor, and a fixed value resistor serially connected to the variable resistor and connected in parallel to the switch, and the fixed value resistor is set so as to have a resistance value at which the semiconductor laser does not emit excessively when the variable resistor is set to a fixed resistance value even if the switch short-circuits electrically the fixed resistor. It is preferable that the one resistor is formed of a variable resistor to vary continuously the voltage division ratio.

Furthermore, a heat dissipating member of a conductive material is mounted on said semiconductor laser for dissipating the semiconductor laser through an intermediate member having a thickness equivalent to that of a thermally contacted member. In this case, it is preferable that heat dissipating member is grounded.

According to the first aspect of the present invention, the semiconductor laser control device is constituted of a semiconductor laser, light amount monitoring means, first feedback control means, second feedback control means, and control mode selecting means. The second time constant is set to be longer than the first time constant. When the light amount of the semiconductor laser is less than a predetermined value, the light amount of the semiconductor laser is subjected to a feedback control in accordance with the first time constant. When the light amount of the semiconductor laser is more than a predetermined value, the light amount of the semiconductor laser is subjected to a feedback control in accordance with the second time constant. Therefore a predetermined light amount can be established at a proper glowing time. There is an advantage in that an error due to noises in the feedback system can be compensated properly after the arrival at the light amount.

According to the second aspect of the present invention, the semiconductor laser control device is constituted of a semiconductor laser, light amount monitoring means, first feedback control means, second feedback control means, and control mode selecting means. A predetermined time is set to be longer than the time when the light amount of the semiconductor laser reaches at a predetermined value based on the first time constant, and the second time constant is set to be longer than the first time constant. After the semiconductor laser has changed from a non-glowing state to a glowing state, the light amount of the semiconductor laser is subjected to an feedback control based on the first time constant till a predetermined time. When the semiconductor laser has changed from a non-glowing state to a glowing state, the light amount of the semiconductor laser is subjected to a feedback control based on the second time constant after a lapse of the predetermined time. Hence the simplified structure can provide the similar advantage to that of the first aspect of the present invention.

According to the third aspect of the present invention, the semiconductor laser control device is constituted of a semiconductor laser, light amount monitoring means, drive current measuring means, first feedback control means, second feedback control means, and control mode selecting means. The second time constant is set to be longer than the first time constant. When the drive current of the semiconductor laser is less than a predetermined value, the light amount of the semiconductor laser is subjected to a feedback control in accordance with the first time constant. When the drive current of the semiconductor laser is more than the predetermined value, the light amount of the semiconductor laser is subjected to a feedback control in accordance with the second time constant. Therefore the similar advantage to that of the semiconductor laser control device according to the first aspect of the invention can be obtained by arranging merely a small device to the semiconductor laser control device. The semiconductor laser driving current can be increased effectively.

According to the fourth aspect of the present invention, the semiconductor laser control device is constituted of a semiconductor laser, light amount monitoring means, drive current measuring means, first feedback control means, second feedback control means, third feedback control means, and control mode selecting means. The third time constant is set to be longer than the second time constant and the second time constant is set to be longer than the first time constant. When the drive current of the semiconductor laser is less than a predetermined value, the light amount of the semiconductor laser is subjected to a feedback control in accordance with the first time constant. When the drive current of the semiconductor laser is more than a predetermined value, the light amount of the semiconductor laser is subjected to a feedback control in accordance with the second time constant. When the light amount of the semiconductor laser is more than a predetermined value, the light amount of the semiconductor laser is subjected to a feedback control based on the third time constant. Therefore the similar advantages to those of the semiconductor laser control device according to the first and third aspects of the invention can be obtained by arranging merely a small device to the semiconductor laser control device. The semiconductor laser drive current can be increased more effectively in comparison with the third aspect of the present invention.

According to the fifth aspect of the present invention, the semiconductor laser control device is constituted of a semiconductor laser, light amount monitoring means, feedback control means, a low pass filter, and control mode selecting means. When the light amount of the semiconductor laser is more than a predetermined value, a light amount monitoring signal is sent to the feedback control means via the low pass filter. There are advantages in that the similar effect to that of the semiconductor laser control device of the first aspect of the present invention can be obtained and the choices in design can be widened.

According to the sixth aspect of the present invention, the semiconductor laser control device is constituted of a semiconductor laser, light amount monitoring means, feedback control means, a low pass filter, and control mode selecting means. After a predetermined period of time when the light amount of the semiconductor laser control device has exceeded at a predetermined value, a light amount monitoring signal is inputted to the feedback control means via the low pass filter. Thus the similar effect to that of the semiconductor laser control device of the fifth embodiment of the present invention can be obtained. The timing at which the light amount signal is passed through the low pass filter can be adjusted arbitrarily and effectively.

According to the seventh aspect of the present invention, the semiconductor laser control device is constituted of a semiconductor laser, light amount monitoring means, feedback control means, a low pass filter, on/off control means, and control mode selecting means. After a predetermined period of time when the semiconductor laser control device has changed from an off state to an on state, the light amount monitoring signal is inputted to the feedback control means via the low pass filter. Thus the similar effect to that of the semiconductor laser control device in the sixth embodiment of the present invention can be effectively obtained by a more simplified structure.

According to the eighth aspect of the present invention, the semiconductor laser control device is constituted of a semiconductor laser, light amount monitoring means, current/voltage converting means, monitoring voltage dividing means having two resistors, feedback control means, and a switch for short-circuiting one of the resistors of the monitoring voltage dividing means to vary the voltage division ratio. Thus even if the monitoring current value is large, the light amount of the semiconductor laser can be adjusted sufficiently and effectively by using the knob of a variable resistor.

Furthermore, the monitoring voltage dividing means is formed of a variable resistor and a fixed value resistor connected serially to each other. A switch is connected in parallel to the resistor. Even if the switch short-circuits the fixed resistor while the variable resistor is set to be a predetermined value, the laser output of the device can be stabilized because of the resistance value of the fixed resistor, whereby the overshooting can be prevented effectively.

Moreover there is an advantage in that one of the resistors is formed of a variable resistor, the range of the voltage division ratio of the variable resistor to the rotational angle of the knob can be adjusted arbitrarily and continuously.

According to the ninth aspect of the present invention, a heat dissipating member of conductive material is mounted on a semiconductor laser via an intermediate member of non-conductive material having a thickness equivalent to that of the thermally contacted member. Hence since the heat generated in the semiconductor laser and the light amount monitoring means in the semiconductor laser control device can be released, the semiconductor laser and the light amount monitoring means can be prolonged in its operational life. Moreover, the heat dissipating member grounded can prevent an undesired current from flowing the semiconductor laser and the light amount monitoring means so that each element can be effectively prolonged in its operational life.

DESCRIPTION OF THE PREFERRED EMBODIMENTS

Referring to the attached drawings, an explanation will be made in detail as for preferred embodiments of the method and device for controlling a semiconductor laser according to the present invention.

Figure 1:
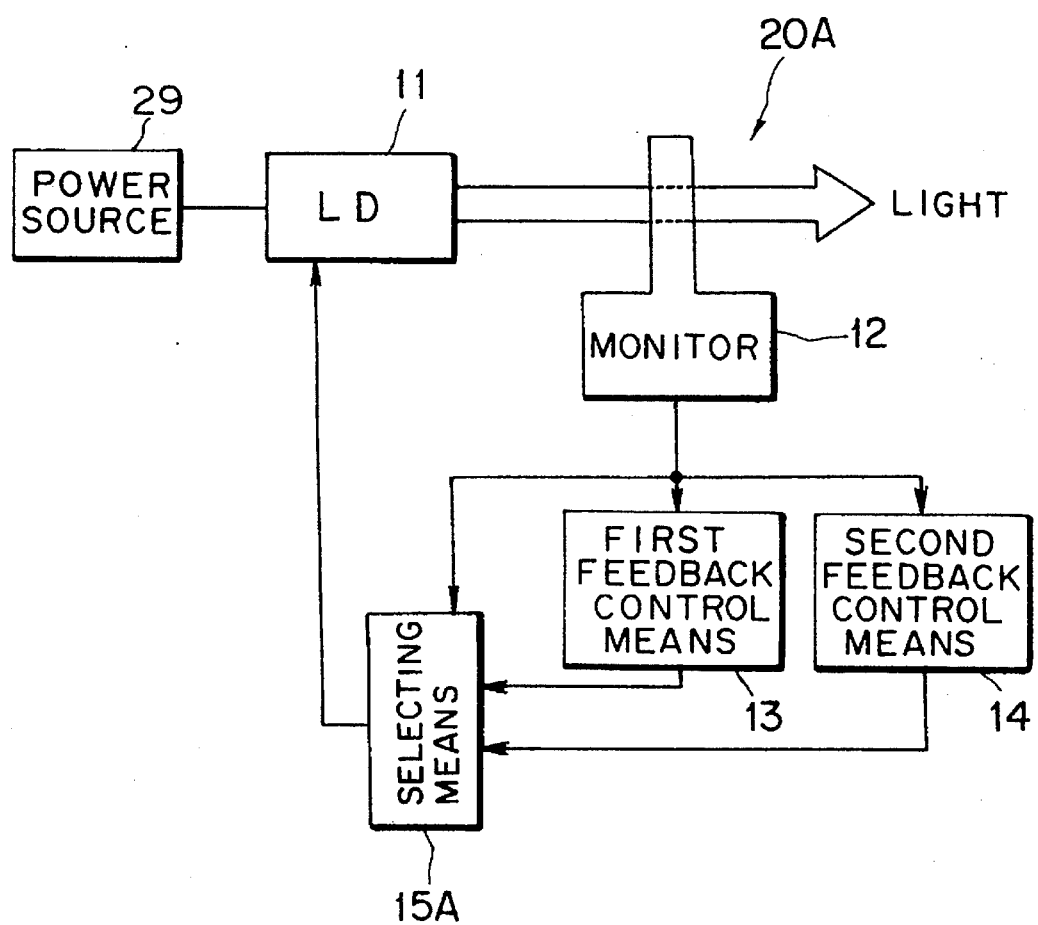
FIG. 1 is a principle block diagram showing the first aspect of the present invention.

(a) Explanation of the principle of the invention:

FIG. 1 is a block diagram showing the first aspect of the present invention. In FIG. 1, a semiconductor laser control device 20A is constituted of a semiconductor laser 11, light amount monitoring means 12, first feedback control means 13, second feedback control means 14, control mode selecting means 15A, and a power source 29.

The semiconductor laser 11 is a light amount controllable laser controlled with current. The light amount monitoring means 12 monitors the light amount of the semiconductor laser 11.

The first feedback control means 13 executes a feedback control of the light amount of the semiconductor laser 11 with the first time constant based on the monitoring result from the light amount monitoring means 12. The second feedback control means 14 executes a feedback control of the light amount of the second semiconductor laser 11 with a second time constant based on the monitoring result from the light amount monitoring means 12.

The control mode selecting means 15A selects a control mode selected by the first feedback control means 13 based on the monitoring result from the light amount monitoring means 12 when the light amount is less than a predetermined value, and selects a control mode selected by the second feedback control means 14 when the light amount is more than the predetermined value. The second time constant is set to be longer than the first time constant.

Figure 2:
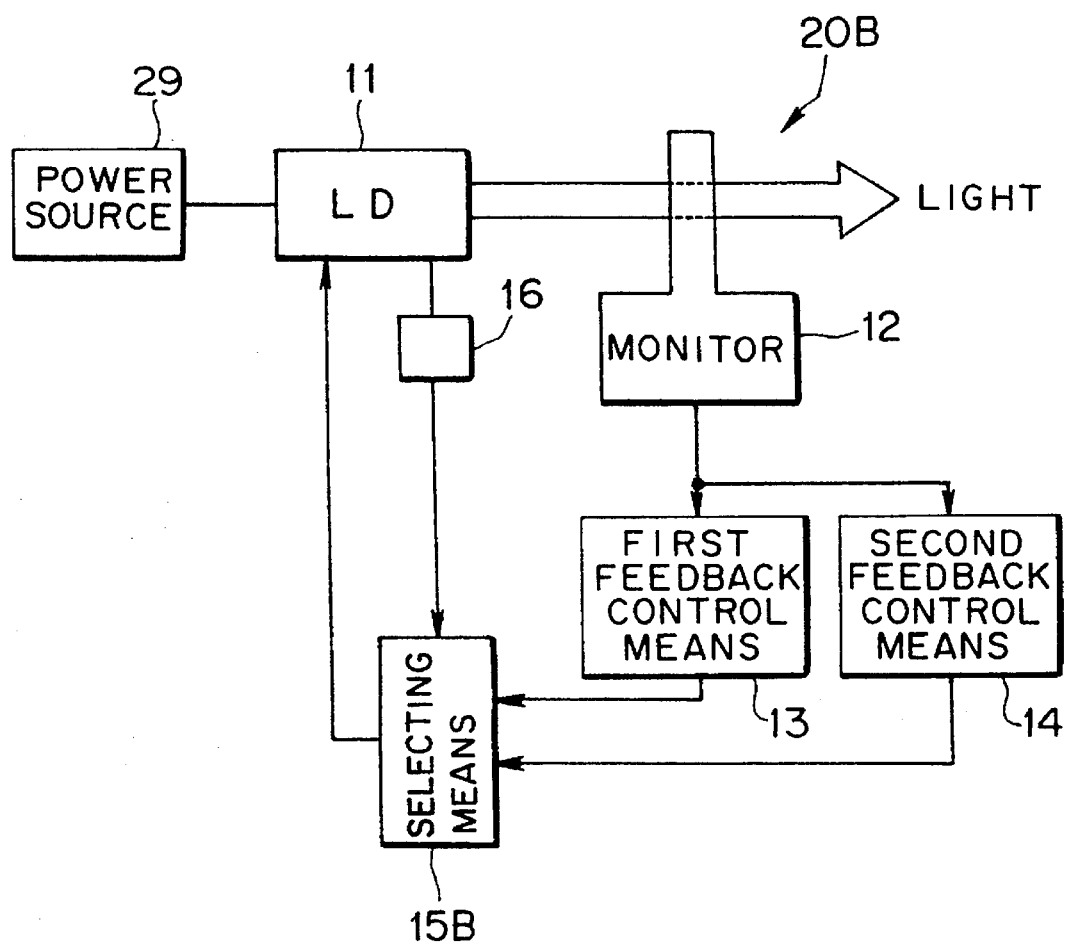
FIG. 2 is a principle block diagram showing the second aspect of the present invention.

FIG. 2 is a principle diagram showing the second aspect of the present invention. In FIG. 2, numeral 20B represents a semiconductor laser control device. The semiconductor laser beam device 20B is constituted of a semiconductor laser 11, a light amount monitoring means 12, first feedback control means 13, second feedback control means 14, control mode selecting means 15B, on/off control means, and a power source 29.

As for the semiconductor laser 11, the light amount monitoring means 12, the first feedback control means 13, and the second feedback control means 14, the explanation has been made with reference to the first aspect of the invention. In the first feedback control means 13 and the second feedback control means 14, the first time constant is set to be longer than the second time constant, in the similar manner to the semiconductor laser control device 20A.

The control mode selecting means 15B selects a control mode selected by the first feedback control means 13 for a predetermined period of time when the on/off control means 16 has changed the semiconductor laser 11 from an on state to an off state, and selects a control mode selected by the second feedback control means 14 after the predetermined period of time when the on/off control means 16 has changed the semiconductor laser 11 from an off state to an on state.

The predetermined time is set to be longer than the time that the semiconductor laser 11 emits a light beam of a predetermined light amount in accordance with the first time constant of the first feedback control means 13. The first time constant is set to be longer than the second time constant.

Figure 3:
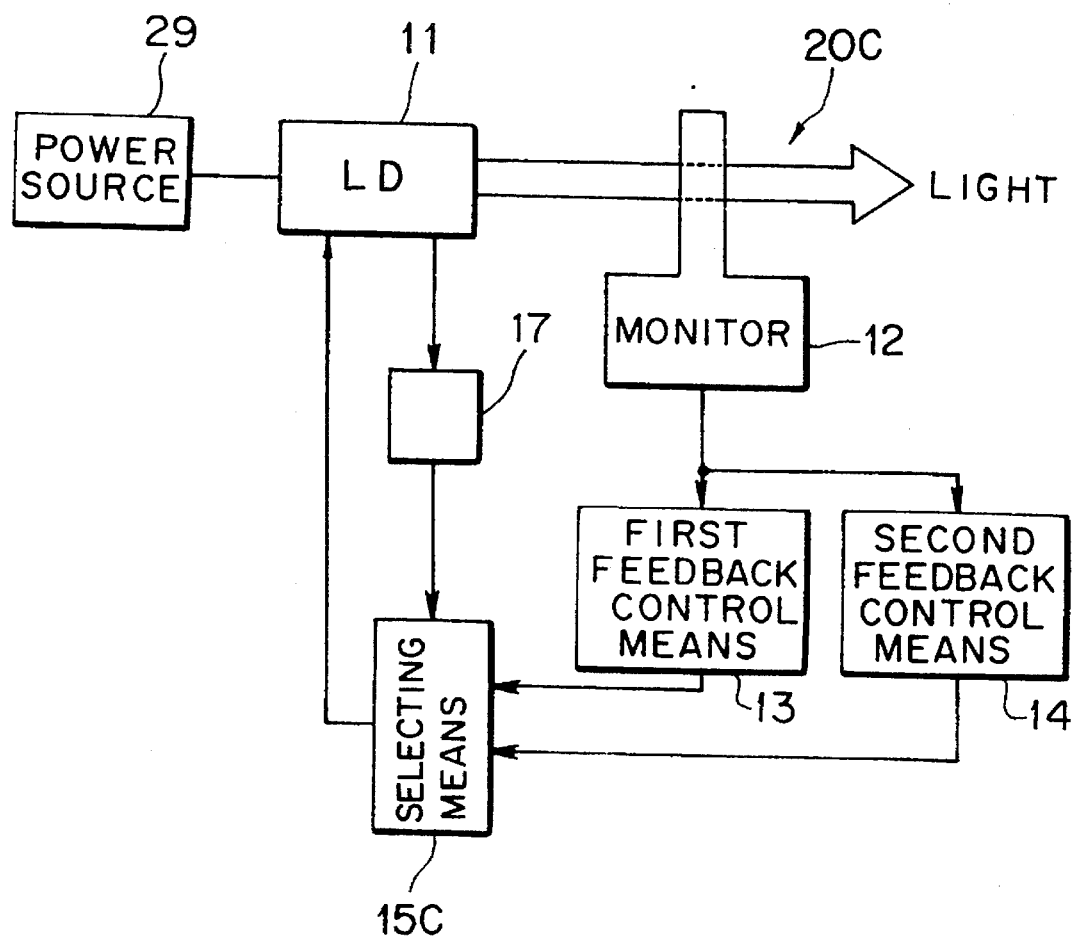
FIG. 3 is a principle block diagram showing the third aspect of the present invention.

FIG. 3 is a principle block diagram showing the third aspect of the present invention. In FIG. 3, the semiconductor laser control device 20c is consisted of a semiconductor laser 11, light amount monitoring means 12, a first feedback control means 13, second feedback control means 14, control mode selecting means 15C, drive current measuring means 17, and a power source 29.

As for the semiconductor laser 11, the light amount monitoring means 12, the first feedback control means 13, the second feedback control means 14, the functions are similar to those explained with the first aspect of the invention. In the first feedback control means 13 and the second feedback means 14, the first time constant is set to be longer than the second time constant, as described with the semiconductor laser control device 20A.

The drive current measuring means 17 measures the drive current of the semiconductor laser 11. The control mode selecting means 15C selects a control mode by means of the first feedback control means 13 based on the measuring result from the drive current measuring means 17 when the drive current is less than a predetermined value. When the drive current is more than the predetermined value, the control mode selecting means 15C selects a control mode by means of the second feedback control means 14.

Figure 4:
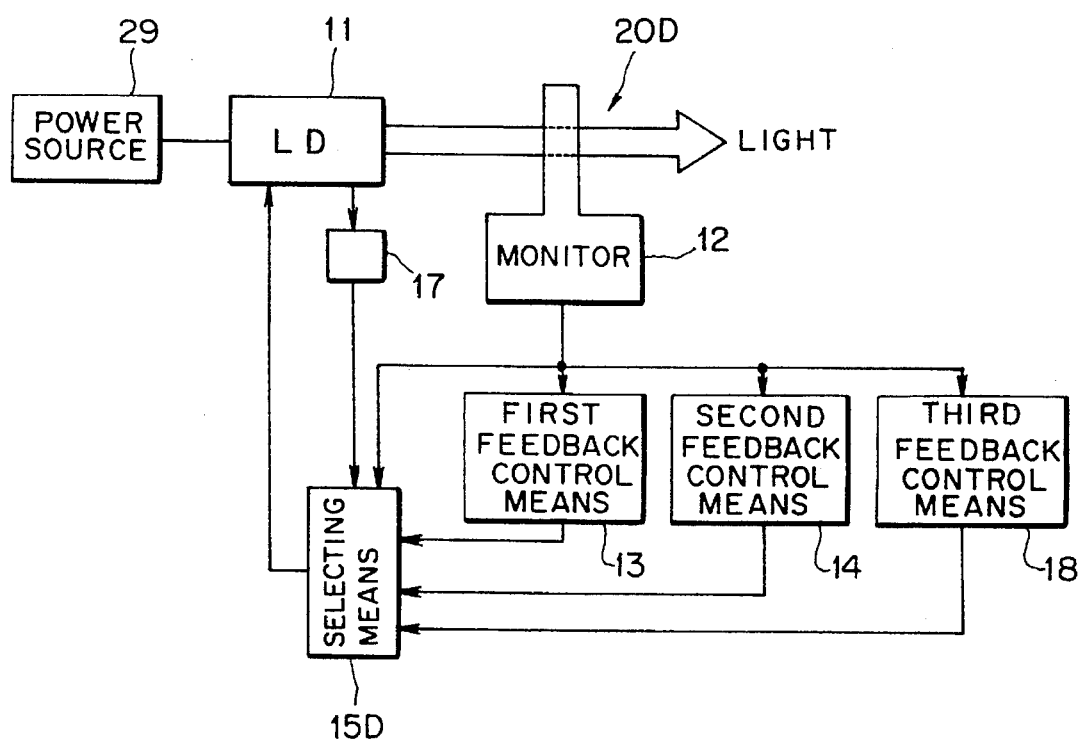
FIG. 4 is a principle block diagram showing the fourth aspect of the present invention.

FIG. 4 is a principle block diagram showing the fourth aspect of the present invention. In FIG. 4, numeral 20D represents a semiconductor laser control device. The semiconductor laser control device 20D is constituted of a semiconductor laser 11, light amount monitoring means 12, first feedback control means 13, second feedback control means 14, third feedback control means 18, control mode selecting means 15D, drive current measuring means 17, and a power source 29.

As for the semiconductor laser 11, the light amount monitoring means 12, the first feedback control means 13, the second feedback control means 14, and the drive current measuring means 17, the functions are similar to those explained with the third aspect of the invention. The third feedback control means 18 perform a feedback control of the light amount from the semiconductor laser 11 with the third time constant, based on the monitoring result from the light amount monitoring means 12.

The control mode selecting means 15D selects a control mode by means of the first feedback control means 13 based on the measuring result of the drive current measuring means 17 and the light amount monitoring means 12 when the drive current is less than a predetermined value. The control mode selecting means 15D also selects a control mode by means of the second feedback control means 14 when the drive current is more than a predetermined value and selects a control mode by means of the third feedback control means 18 when the light amount is more than a predetermined value.

The third time constant is set to be longer than the second time constant and the second time constant is set to be longer than the first time constant.

Figure 5:
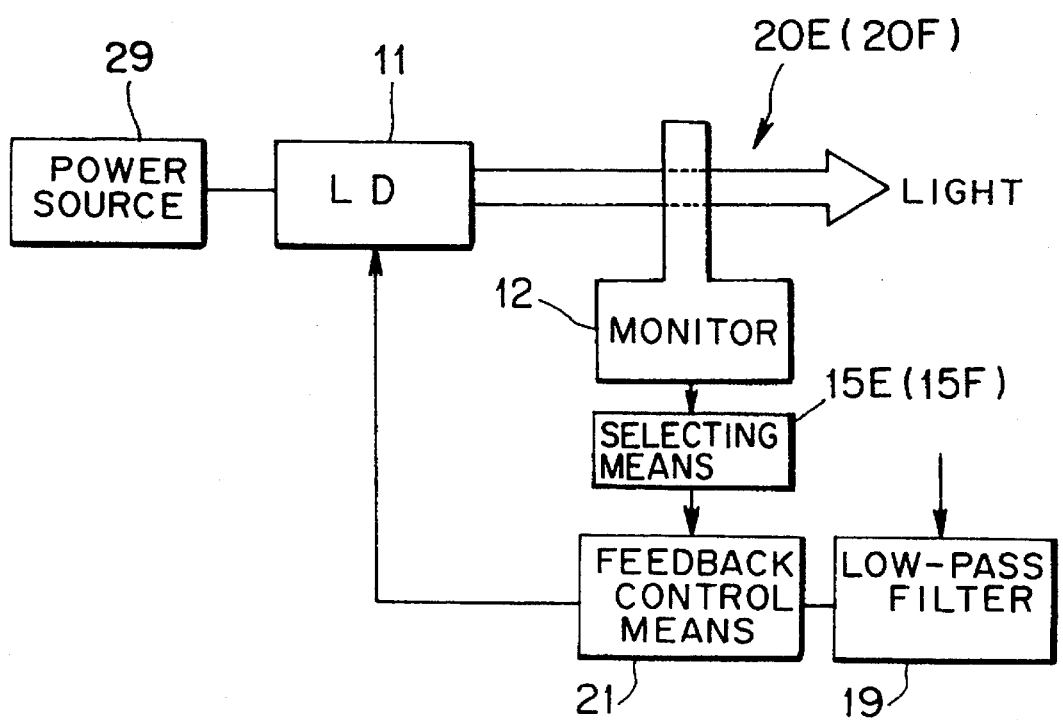
FIG. 5 is a block diagram showing the fifth and sixth aspects of the present invention.

FIG. 5 is a principle block diagram showing the fifth aspect of the invention. In FIG. 5, numeral 20E represents a semiconductor laser control device. The semiconductor laser control device 20E is formed of a semiconductor laser 11, light amount monitoring means 12, selecting means 15E, a low pass filter 19, and feedback control means 21.

As for the semiconductor laser 11 and the light amount monitoring means 12, the functions are similar to those described in the first aspect of the invention. The feedback control means 21 executes a feedback control of the light amount of the semiconductor laser 11 with a predetermined time constant based on the monitoring result of the light amount monitoring means 12. The low pass filter 19 passes the low frequency component of the monitoring signal from the light amount monitoring means 12.

The selecting means 15E inputs the monitoring signal from the light amount monitoring means 12 to the feedback control means 21 via the low pass filter 19 based on the monitoring result from the light amount monitoring means 12 when the light amount is more than a predetermined value.

FIG. 5 is a principle diagram showing the sixth aspect of the present invention. In FIG. 5, numeral 20F represents a semiconductor laser control device. The semiconductor laser device 20F is formed of a semiconductor laser 11, light amount monitoring means 12, selecting means 15F, a low pass filter 19, a power source 29, and feedback control means 21.

As for the semiconductor laser 11, the light amount monitoring means 12, the low pass filter 19, and the feedback control means 21, the functions are similar those described with the first and fifth aspects of the present invention. The selection means 15F inputs the monitoring signal from the light amount monitoring means 12 to the feedback control means 21 via the low pass filter based on the monitoring result of the light amount monitoring result 12 after a predetermined period of time when the light amount has been more than the predetermined value.

Figure 6:
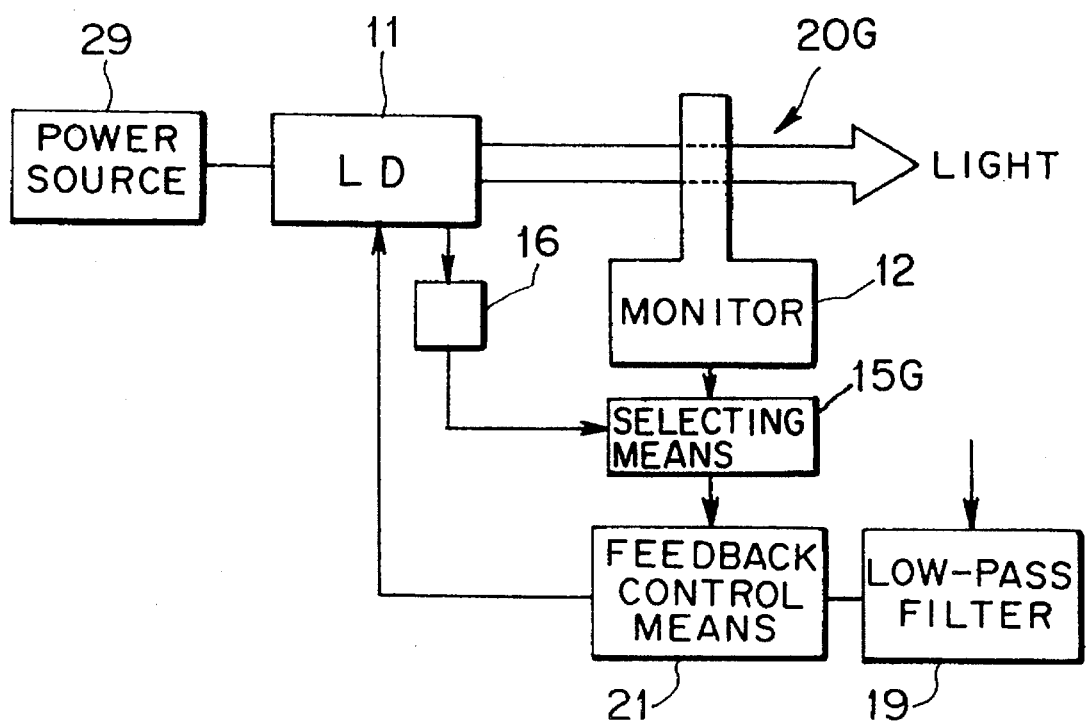
FIG. 6 is a principle block diagram showing the seventh aspects of the present invention.

FIG. 6 is a principle diagram showing the seventh aspect of the invention. In FIG. 6, numeral 20G represents a semiconductor laser control device. The semiconductor laser control device 20G is constituted of a semiconductor laser 11, light amount monitoring means 12, selecting means 15G, on/off control means 16, a low pass filter 19, a power source 29, and feedback control means 21. The semiconductor laser 11, the light amount monitoring means 12, the on/off control means 16, the low pass filter 19, and the feedback control means 21 have been explained with the first and fifth aspects of the present invention.

The selecting means 15G inputs the monitoring signal from the light amount monitoring means 12 to the feedback control means 21G via the low pass filter after a predetermined period of time when the on/off control means 16 has changed the semiconductor laser 11 from an off state to an o n state.

Figure 7:
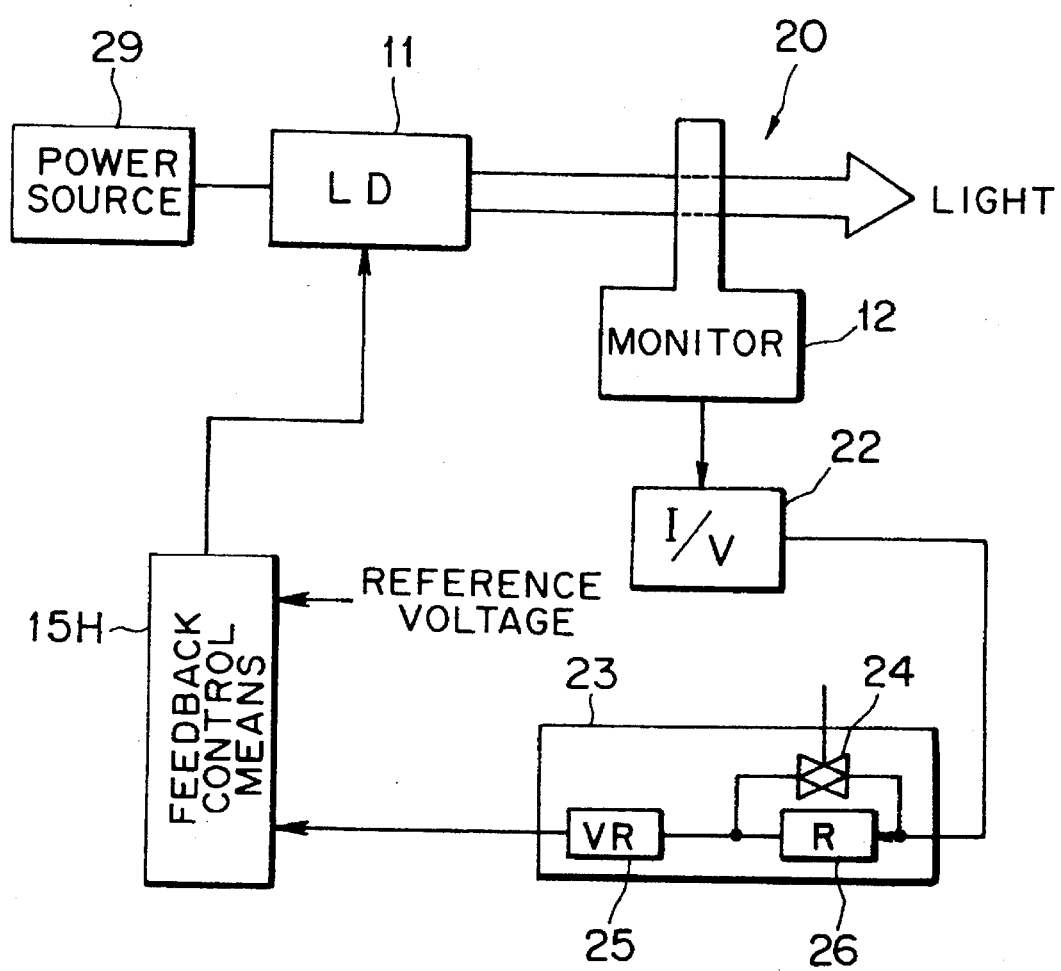
FIG. 7 is a principle block diagram showing the eighth aspect of the present invention.

FIG. 7 is a principle diagram showing the eighth aspect of the present invention. In FIG. 7, numeral 20 is a semiconductor laser control device. The semiconductor laser control device 20 is constituted of a semiconductor laser 11, light amount monitoring means 12, current/voltage converting means 22, and monitoring means 23, and a power source 29.

The semiconductor laser 11 and the light amount monitoring means 12 act as described in the foregoing aspects of the present invention. The current/voltage converting means 22 converts the monitoring current from the light amount monitoring means 12 into a voltage. The monitoring voltage dividing means 23 divides a monitoring voltage converted by the current/voltage converting means 22, and is formed of two resistors 25 and 26 connected serially to each other.

The switch 24 is arranged across the resistor 26 in the monitoring voltage dividing means 23 and short-circuits electrically the resistor 26 to vary the voltage division ratio. The feedback control means 15H executes a feedback control of the light amount of the semiconductor laser 11 so as to equalize the monitoring dividing signal from the monitoring voltage dividing means 23 with a reference voltage. The resistor 26 may be a variable resistor to vary continuously the voltage dividing ratio.

The monitoring voltage dividing means 23 may be formed of a variable resistor 25, a fixed resistor 26 serially connected to each other, and a switch 24 connected in parallel with the fixed resistor 26. In this case, when the variable resistor 25 is set to a predetermined position, the fixed resistor 26 has a resistance value that a semiconductor laser 11 does not emit excessively even if the switch 24 short-circuits electrically the fixed resistor 26 when the variable resistor 25 is set to a predetermined position.

Figure 8:
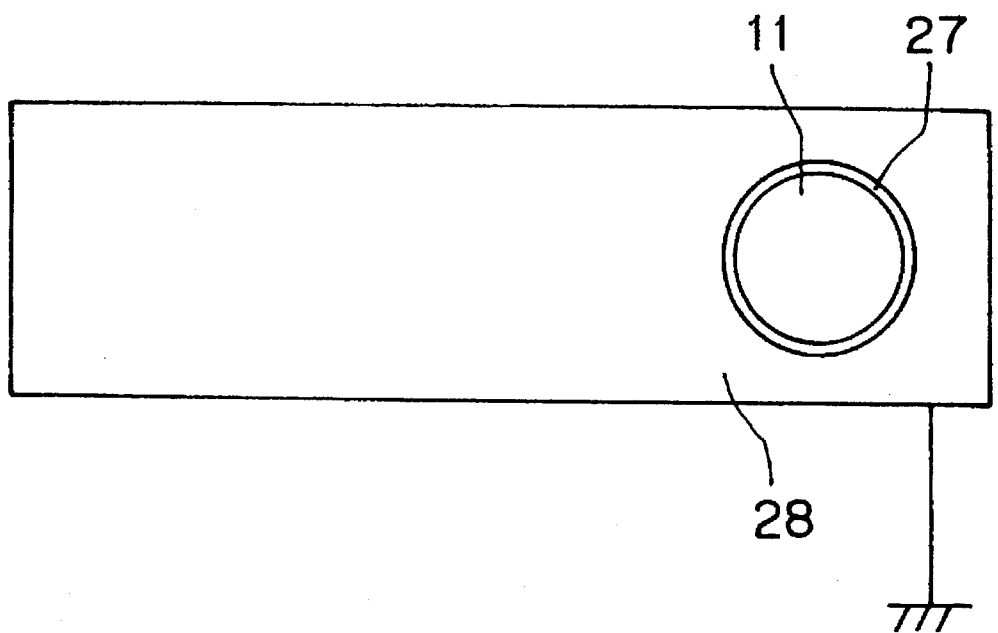
FIG. 8 is a principle block diagram showing the ninth aspect of the present invention.

FIGS. 8 is principle diagrams showing the ninth aspect of the present invention. In FIG. 8, numeral 11 represents a light emitting diode. The light emitting diode 11 is mounted on the heat dissipating member 28 of a conductive material via an intermediate member 27 of non-conductive material. The intermediate member 27 is made of a non-conductive material having a thickness equivalent to that contacted thermally. The heat dissipating member 28 is formed of a heat conductive material to dissipate the heat from the semiconductor laser 11. The heat dissipating member 28 is grounded.

According to the first aspect of the invention, as shown in FIG. 1, the semiconductor laser control device 20A executes a feedback of the light amount of the semiconductor laser 11 with a predetermined time constant while a light amount is monitored by the light amount monitoring means 12 of the semiconductor laser 11. As a result, the light amount control is performed by adjusting the current to the semiconductor laser 11.

The selection of the time constant in the light amount control is performed by the control mode selecting means 15A. That is, when the light amount from the semiconductor laser 11 is less than a predetermined value, the first feedback control means 13 selects a control mode to perform a feedback control of the semiconductor laser 11 with the second time constant longer than the first time constant by selecting a control mode by the second feedback control means when the light amount exceeds a predetermined value.

In the second aspect of the present invention, as shown in FIG. 2, the semiconductor laser control device 20B performs a feedback control of the semiconductor laser 11 with a predetermined time constant while the light amount monitoring means 12 to the semiconductor laser 11 monitors the light amount.

The selection of the time constant in the feedback control is performed by the control mode selection means 15B. When the on/off control means 16 controls the semiconductor laser 11 from an on state to an off state, the first feedback control means 13 selects the control mode for a predetermined time, thus performing a feedback control of the semiconductor laser 11 with the first time constant longer than the second time constant. As a result, the light amount of the semiconductor laser 11 reaches to a predetermined value in the predetermined period of time with the first time constant.

On the other hand, when the semiconductor laser 11 changes from an off state to an on state, the second feedback control means 14 selects the control mode after a lapse of the predetermined time and the light amount of the semiconductor laser 11 is subjected to an feedback control in accordance with the second time constant.

In the third aspect of the present invention, as shown in FIG. 3, the semiconductor laser control device 20C performs a feedback control of the semiconductor laser 11 with a predetermined time constant while the light amount monitoring means 12 to the semiconductor laser 11 is monitored.

The selection of the time constant in the feedback control is performed by the control mode selection means 15C. Namely, the drive current measuring means 17 measures the drive current of the semiconductor laser 11. When the drive current of the semiconductor laser 11 is less than a predetermined value, the first feedback control means 13 selects the control mode, so that the light amount of the semiconductor laser 11 is subjected to a feedback control with the first time constant.

On the other hand, when the drive current of the semiconductor laser 11 is larger than the predetermined value, the second feedback control means 14 selects the control mode, so that the light amount of the semiconductor laser 11 is subjected to an feedback control in accordance with the second time constant.

According to the fourth aspect of the present invention, as shown in FIG. 4, the semiconductor laser control device 20D executes a feedback of the light amount of the semiconductor laser 11 in accordance with the predetermined time constant while the light amount monitoring means 12 for the semiconductor laser 11 monitors the light amount.

The selection of the time constant in the feedback control is performed by the control mode selecting means 15D and based on the measuring result of the drive current measuring means 17 and the light amount monitoring means 12.

When the drive current of the semiconductor laser 11 is less than a predetermined value, the first feedback control means 13D selects the control mode, so that the light amount of the semiconductor laser 11 is subjected to a feedback control in accordance with the first time constant.

When the drive current of the semiconductor laser 11 is larger than a predetermined value, the second feedback control means 14D selects the control mode, so that the light amount of the semiconductor laser 11 is subjected to a feedback control in accordance with the second time constant longer than the first time constant.

When the light amount of the semiconductor laser 11 is larger than the predetermined value, the third feedback control means 18 selects the control mode, so that the light amount of the semiconductor laser 11 is subjected to a feedback control in accordance with the third time constant longer than the second time constant.

In the fifth aspect of the present invention, as shown in FIG. 5, the semiconductor laser control means 20E executes a feedback of the light amount of the semiconductor laser 11 in accordance with a predetermined time constant while the light amount monitoring means 12 for the semiconductor laser 11 monitors the light amount.

That is, when the light amount of the semiconductor laser 11 is less than a predetermined value, the feedback control means 21E subjects the light amount of the semiconductor laser 11 to a feedback control in accordance with the predetermined time constant based on the monitoring result from the light amount monitoring means 12.

The selecting means 15E inputs the light amount monitoring signal to the feedback control means 21E via the low pass filter 19 based on the monitoring result from the light amount monitoring means 12 when the light amount of the semiconductor laser 11 becomes larger than the predetermined value. In this case, the low pass filter 19 passes the low frequency component of the monitoring signal.

In the sixth aspect of the present invention, as shown in FIG. 5, the semiconductor laser control device 20F controls the feedback of the light amount of the semiconductor laser 11 in accordance with a predetermined time constant while the light amount monitoring means 12 of the semiconductor laser 11 monitors the light amount.

The light amount of the semiconductor laser 11 is subjected to a feedback control by the feedback control means 21F with the predetermined time constant based on the monitoring result from the light amount monitoring means 12 for a predetermined period of time after the light amount of the semiconductor laser 11 has exceeded the predetermined value.

For the predetermined period of time after the light amount from the semiconductor laser 11 has exceeded the predetermined value, the selecting means 15F passes the light amount monitoring signal to the feedback control means 21F via the low pass filter 19. In this case, the low pass filter 19 passes the low frequency component of the monitoring signal.

In the seventh aspect of the present invention, as shown in FIG. 6, the semiconductor laser control device 20F executes a feedback control of the light amount from the semiconductor laser 11 with a predetermined time constant while the light amount monitoring means 12 for the semiconductor laser 11 monitors the light amount.

After a lapse of a predetermined time when the semiconductor laser 11 has changed from an off sate to an on state, the selecting means 15G inputs the light amount monitoring signal to the feedback control means 21G through the low pass filter 19. In this case, the low pass filter 19 passes the low frequency component of the monitoring signal.

In the eighth aspect of the present invention, as shown in FIG. 7, the current, which indicates the light amount from the semiconductor laser 11 detected by the light amount monitoring means 12 in the semiconductor laser control device 20, is converted into a voltage by means of the current/voltage converting means 22 and the voltage is divided by the monitoring voltage dividing means 23.

The feedback control means 15H executes a feedback control of the light amount of the semiconductor laser 11 so as to equalize the monitoring divided voltage signal form the monitoring voltage dividing means 23 with the reference voltage. When the voltage division ratio is varied, the switch 24 connected across the resistor 26 in the monitoring voltage dividing means 23 short-circuits electrically the resistor 26.

The monitoring voltage dividing means 23 is formed of a variable resistor 25 and a fixed resistor 26 serially connected to each other. When the switch 24 is connected in parallel to the fixed resistor 26 set to a predetermined position, the semiconductor laser 11 does not emit excessively even if the switch short-circuits the resistor 26 when the variable resistor 25 is set to a predetermined position. If the resistor 26 is a variable resistor, the voltage division ratio is varied continuously and purposely.

The semiconductor laser control device in the ninth aspect of the present invention, as shown in FIG. 8, the heat generated in the semiconductor laser 11 is conducted to the heat dissipating member 28 via the intermediate member 27 to dissipate externally.

Even if noises due to external electromagnetic waves or electrostatic electricity are transmitted to the semiconductor laser 11 through the heat dissipating member 28, the electricity charged on the heat sink member 28 is released because of the shielding effect of the intermediate member 27 and the heat dissipating member 28 grounded.

According to the first aspect of the invention, since the structure is formed of the semiconductor laser 11, the light amount monitoring means 12, the first feedback control means 13, the second feedback control means 14, and the control mode selecting means 15A. The second time constant is set to be longer than the first time constant. When the light amount of the semiconductor laser is less than a predetermined value, the light amount of the semiconductor laser is subjected to a feedback control in accordance with the first time constant. When the light amount is set to be more than the predetermined value, the light amount of the semiconductor laser is subjected to a feedback control in accordance with the second time constant. Therefore there is an advantage in that a predetermined light amount can be obtained in a suitable emitting time and a proper compensation can be made to errors due to noise in the feedback system after a predetermined light amount has been established.

According to the second aspect of the present invention, the structure includes a semiconductor laser 11, light amount monitoring means 12, first feedback control means 13, second feedback control means 14, and a control mode selecting means 15B. The predetermined time is set to be longer than time that the semiconductor laser settles to the predetermined light amount in accordance with the first time constant. The second time constant is set to be longer than the first time constant. The light amount of the semiconductor laser is subjected to a feedback control with the first time constant after a predetermined period of time when the semiconductor laser has changed from an off state to an state. The light amount of the semiconductor laser is subjected to a feedback control with the second time constant for a predetermined period of time when the semiconductor laser has changed from an off state to an on state. The similar advantage to that of the first aspect of the present invention can be obtained by the simplified structure.

According to the third aspect of the present invention, the structure includes a semiconductor laser 11, light amount monitoring means 12, drive current measuring means 17, first feedback control means 13, second feedback control means 14, and control mode selecting means 15C. The second time constant is set to be longer than the first time constant. The light amount of the semiconductor laser is subjected to a feedback control with the first time constant when the drive current of the semiconductor laser is less than a predetermined value. The light amount of the semiconductor laser is subjected to a feedback control with the second time constant when the drive current of the semiconductor laser is more than the predetermined value. The similar advantage to that of the semiconductor laser control device according to the first aspect of the present invention can be realized by adding merely a small device to the semiconductor laser control device by the simplified structure. The semiconductor laser drive current can be increased effectively.

According to the fourth aspect of the present invention, the structure includes a semiconductor laser 11, light amount monitoring means 12, drive current measuring means 17, first feedback control means 13, second feedback control means 14, third feedback control means 18, and control mode selecting means 15D. The third time constant is set to be longer than the second time constant. The second time constant is set to be longer than the first time constant. The light amount of the semiconductor laser is subjected to a feedback control with the first time constant when the drive current of the semiconductor laser is less than the predetermined value. The light amount of the semiconductor laser is subjected to a feedback control with the second time constant when the drive current of the semiconductor laser is more than predetermined value. The light amount of the semiconductor laser is subjected to a feedback control with the third time constant when the light amount of the semiconductor laser is more than a predetermined value. The similar advantages to those of the semiconductor laser control devices according to the first and third aspects of the present invention can be obtained by adding merely a small device to the semiconductor laser control device. The semiconductor laser drive current can be increased effectively more than the third aspect of the invention.

According to the fifth aspect of the present invention, the structure includes a semiconductor laser 11, light amount monitoring means 12, feedback control means 21, a low pass filter 19, and selecting means 15E. When the light amount of the semiconductor laser is more than the predetermined value, the light amount monitoring signal is inputted to the feedback control means via the low pass filter. Thus there is an advantage in that the degree of freedom in design is widened while the similar advantage to that of the semiconductor laser control devices according to the first aspect of the present invention.

According to the sixth aspect of the present invention, the structure includes a semiconductor laser 11, light amount monitoring means 12, feedback control means 21, a low pass filter 19, and selecting means 15F. The light amount of the semiconductor laser is inputted to the feedback control means via the low pass filter after a predetermined period of time when the drive current of the semiconductor laser is more than the predetermined value. The similar advantages to that of the semiconductor laser control devices according to the fifth aspect of the present invention can be obtained. Moreover the timing to pass the light amount monitoring signal to the low pass filter can be freely adjusted effectively.

According to the seventh aspect of the present invention, the structure includes a semiconductor laser 11, light amount monitoring means 12, feedback control means 21, a low pass filter 19, on/off control means 16, and selecting means 15G. The light amount monitoring signal is inputted to the feedback control means via the low pass filter after a predetermined period of time when the semiconductor laser is changed from an off state to an on state. The similar advantages to that of the semiconductor laser control devices according to the sixth aspect of the present invention can be obtained effectively by a simplified structure.

According to the eighth aspect of the present invention, the structure includes a semiconductor laser 11, light amount monitoring means 12, current/voltage converting mans 22, monitoring voltage dividing means 23 having two resistors, and feedback control means 15H. The structure also includes a switch 24 for short-circuiting one resistor 26 in the monitoring voltage dividing means 23 to vary the voltage division ratio. Hence there is an advantage in that even if the monitoring current value is large, a variable resistor can adjust sufficiently the light amount of the semiconductor laser by using the knob thereof.

Furthermore, the monitoring voltage dividing means 23 is formed by a variable resistor 25 and a fixed value resistor 26 connected serially to each other. A switch 24 is connected across the fixed value resistor 26. When the variable resistor 25 is set to a predetermined position and the fixed value resistor 26 is short-circuited, the fixed resistor 26 is set to a resistance value not to emit excessively the semiconductor laser so that the device can produce effectively its output stabilized and with no overshoot.

Since one resistor is formed as a variable resistor 25 which varies continuously the voltage division ratio, the range of the voltage division ratio of the resistance to the rotation angle of the knob of the variable resistor 25 can be adjusted freely.

According to the ninth aspect of the present invention, the heat sink member 28 of a conductive material is mounted on the semiconductor laser 11 through an intermediate member 27 of non-conductive material having a thickness thermally equivalent to the contacted member dissipating the heat from the semiconductor laser 11. Thus there is an advantage in that the heat from the semiconductor laser of the semiconductor laser control device and the light amount monitoring means can be released externally so that the operational life span thereof can be prolonged.

There is an advantage in that the heat dissipating member 28 grounded can prevent an undesired current flowing through the semiconductor laser and the light amount monitoring means, whereby a prolonged operational life of each device can be obtained.

(b) Explanation of the First Embodiment

The embodiments according to the present invention will be explained below with reference to attached drawings.

Figure 9:
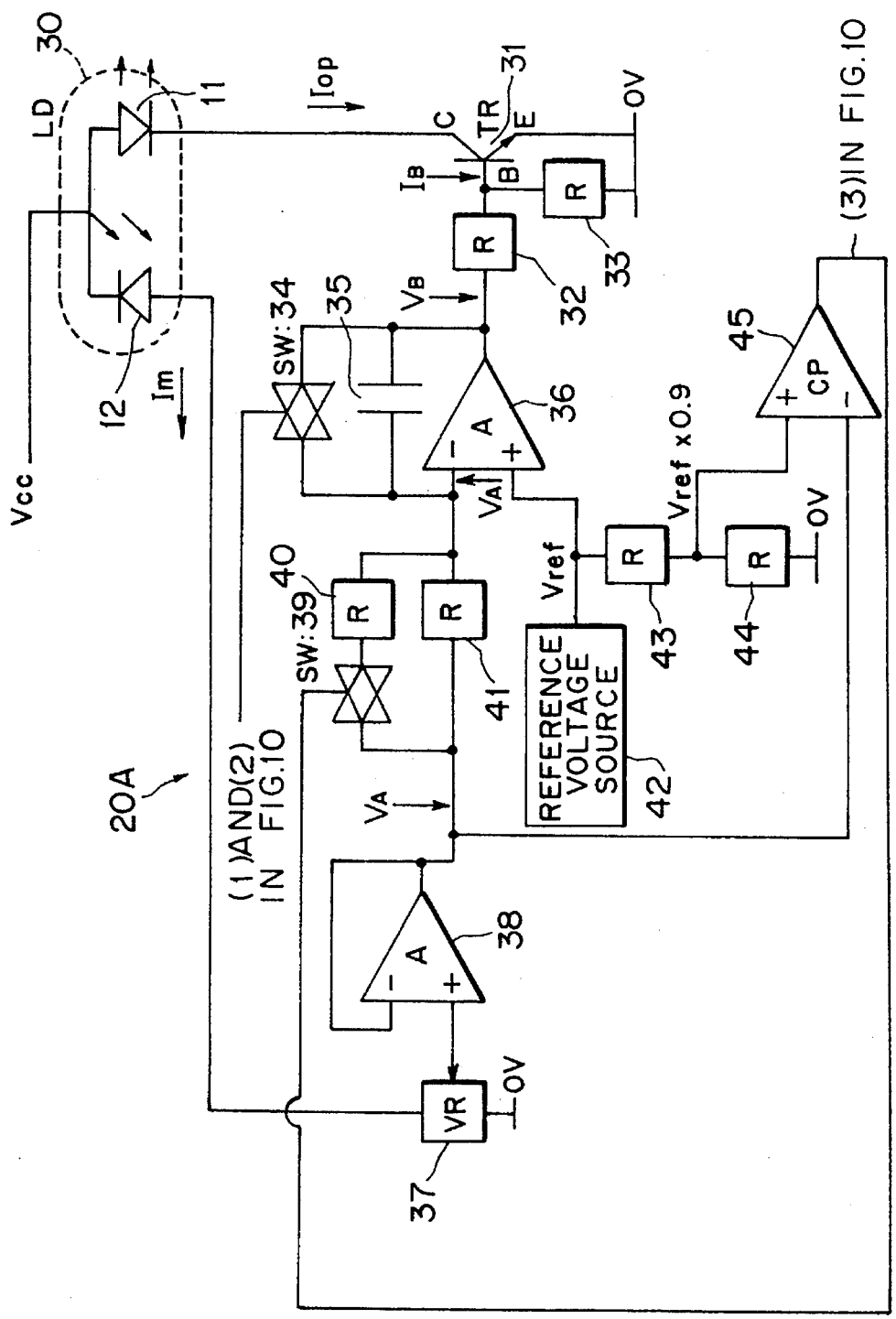
FIG. 9 is a circuit diagram showing the first embodiment of the present invention.

FIG. 9 is a block diagram showing the first embodiment of the present invention. In FIG. 9, numeral 20A represents a semiconductor laser control device. The semiconductor laser control device 20A is arranged in place to the semiconductor laser control devices 3 and 3A. The semiconductor laser control device 20A is constituted of an LD chip (laser diode chip) 30 including a laser diode 11 and a photo diode (light amount monitoring means) 12, a transistor 31, analog switches (SW) 34 and 39, amplifiers (operational amplifiers) 36 and 38, comparator (control mode selecting means) 45, a reference voltage source 42, a capacitor 35, a variable resistor 37, and resistors 32, 33, 40, 41, 43, and 44. Like numerals represent like elements in the related art.

Figure 10:
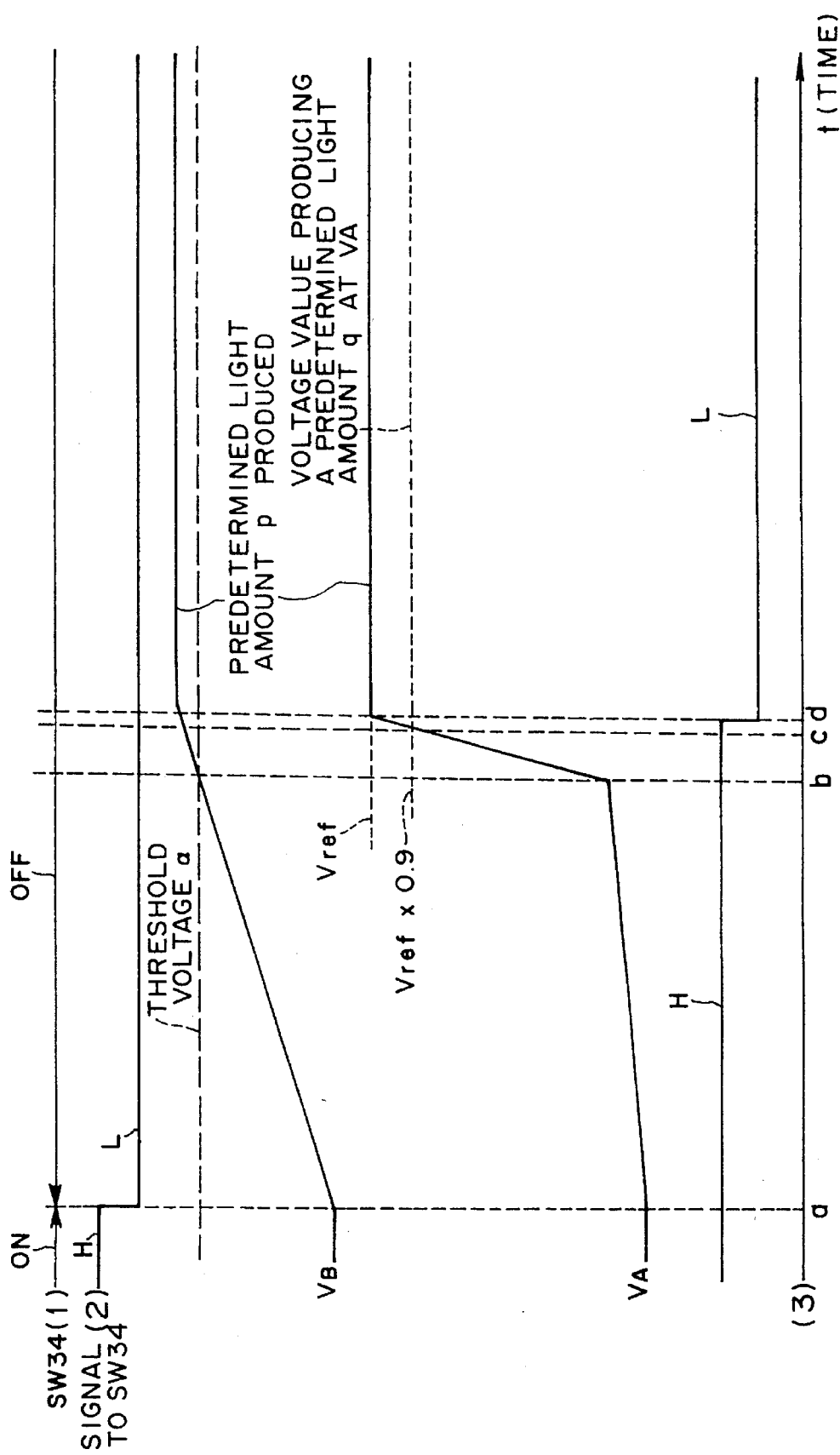
FIG. 10 is a block diagram showing the functions of the first and the second embodiments of the present invention.

The laser diode 11 emits bidirectionally the laser beam when the LD drive current Iop over a predetermined value flows. An external photo diode 12 receives one of the two laser beams with the light receiving surface and outputs the monitoring current Im corresponding to the light amount. The current Im from the photo diode 12 is outputted through the variable resistor 37 and the amplifier 38. FIG. 10 shows the relationship between the voltage $V_A$ after the time b and the proportional constant K ($V_A = KIm$, where $V_A$ is a voltage after the time b).

The external photo diode 12 outputs the current Im proportional to the voltage Vcc when the voltage Vcc is applied forwards without receiving a light on the light receiving surface. The current Im from the photo diode 12 is outputted through the variable resistor 37 and the amplifier 38. In FIG. 10, the current is proportional to the voltage $V_A$ between the time a and the time b in accordance with the proportional constant m ($V_A = mIm$ where $V_A$ is a voltage between the time a and the time b, K>m).

As described in the prior art, the variable resistor 37 converts the current Im to a voltage and adjusts the relation between the current Im and the light amount through the voltage division. The operational amplifier 38 compares the voltage from the variable resistor 37 with the self output. If the voltage from the variable resistor 37 is higher than the feedback voltage, it is outputted to the output side thereof.

The operational amplifier 36 compares the voltage $V_A$ from the amplifier 38 through the resistor with the reference voltage Vref from the reference voltage source 42, and maintains the voltage $V_B$ as it is if both values are equalized.

The capacitor 35 is connected across the amplifier 36 so as to couple the voltage $V_A$ of the negative input side to the voltage of the output side. The resistors 40 and 41 are connected in parallel between the amplifiers 36 and 38. If the compared result between the voltage VA and the reference voltage Vref is different, a process is performed as follows: if the output voltage VA<the reference voltage Vref, the voltage VB is increased with a predetermined time constant, or if the output voltage VA>the reference voltage Vref, the voltage VB is decreased from the reference voltage Vref with the predetermined time constant. The operational amplifier 36 operates so as to equalize the voltage VA with the reference voltage Vref to maintain the output at a fixed value in the feedback system. The reference voltage Vref applied on the positive input side of the operational amplifier 36 is integrated in accordance with a predetermined time constant.

The time constant determining the degree of the variation in the output voltage VB is determined by the dimensions of the capacitor 35, the resistors 40 and 41, and the reference voltage Vref. The time constant is changed by the on/off operation of the analog switch 39 connected serially to the resistor 40. That is, when the analog switch 39 is in an off state, the output voltage VB of the operational amplifier 36 is integrated with a first time constant of, for example, Tc/100 mV/sec (μA/μsec). When the analog switch 39 is in an on state, the output voltage VB of the operational amplifier 36 is integrated with a second time constant of, for example, TcmV/sec (100 μA/μsec). The second time constant is set to be longer than the first time constant. The time constant depends on a period of time which reaches a predetermined value in accordance with the time constant. A small constant has a long time constant. As understood from the time constant, the resistance ratio of the resistors 40 and 41 is expressed as resistor 40/resistor 41=100/1.

In the present circuit, the resistor 40 is selected under the control of the analog switch 39 to add it as the time constant determining factor. Thus two feedback control devices with different time constants are arranged. When one of the control devices is selected, a feedback control of the light amount of the laser diode 11 is performed with the time constant.

The analog switch 34 is turned on in accordance with the control of the CPU to short-circuit the amplifier 36. The analog switch 39, as described above, is arranged so as to connect or disconnect the resistor 40, and is controlled based on the output (see (3) in FIG. 10) from the comparator 45. The transistor 31 has a collector connected forwards to the output of the laser diode 11, a base connected to the resistor 32 and the branched resistor 33 for receiving as the current signal IB via the resistor 32 the signal voltage VB to control the light emitted amount from the laser diode 11, and an emitter grounded. The resistor 33 is grounded. The transistor 31 controls the correct signal current Iop from the laser diode 11 to the amount proportional to the base signal current IB.

The comparator 45 compares the voltage VA from the amplifier 38 corresponding to the light amount of the laser diode 11 with the voltage of 90% of the reference voltage Vref from the reference voltage source 42. If the voltage VA<90% of the reference voltage Vref, the output becomes an H level and if the voltage VA>90% of the reference voltage Vref, the output becomes an L level.

The comparator 45 can select automatically the time constant for determining an increasing and decreasing rate of the output voltage VB from the operational amplifier 36, based on a monitoring result from the external photo diode 12. That is, when the monitoring result of the external photo diode 12 is less than the predetermined value (reference voltage Vref×0.9), the control mode of the time constant Tc mV/sec) is selected if the resistor 40 is connected. When the monitoring result is larger than the predetermined light amount q and the resistor 40 is disconnected, the control mode of the time constant Tc/100 mV/sec is selected.

The receiving portion of the comparator 45 is connected between the resistors 43 and 44 to receive 90% of the reference voltage Vref. One terminal of the resistor 44 is connected to the output side of the reference power source 42. The resistor 44 is grounded in the similar manner to that to the resistor 33. That is, the resistors 43 and 44 are arranged to make 90% of the reference voltage Vref from the reference voltage source 42.

According to the above structure, the external photo diode 12 detects the current Im indicating the light amount of the laser, and the LD drive current Iop is controlled based on the current Im to maintain the light amount of the laser at a fixed value.

A detail explanation will be made below as for the operations for the period between time a and time b, the period between time b and time c, and the period after the time c, as shown in FIG. 10.

Referring to FIG. 10, the operation between the time a and the time b of the semiconductor laser control device 20A is explained. As shown with (1) and (2) in FIG. 10, when the analog switch 34 is turned off in response to the control signal from the CPU, the current Im indicating a detected laser light amount is converted to a voltage VA by means of the variable resistor 37. In this case the current Im has a value proportional to only the voltage Vcc because of no laser oscillation.

Then the voltage VA is compared with 90% of the reference voltage Vref by means of the comparator 45. As a result, since the voltage VA is lower than the reference voltage Vref, the comparator 45 outputs an high (H) level signal, as shown as the voltage VA between the time a and the time b as well as the output (1) of the comparator 45.

When the analog switch 39 receives an H level signal and turns on, the resistor 40 is connected in parallel to the resistor 41, the voltage VA is applied to the operational amplifier 36 and the capacitor 35 via the resistors.

As a result, since the time constant that the output voltage VB of the operational amplifier 36 increases or decreases is Tc mV/sec, the operational amplifier 36 increases its output voltage VB from the reference voltage Vref in accordance with the time constant Tc mV/sec. Thus the base current IB of the transistor 31 increases with the time constant Tc mV/sec while the collector current thereof as an LD drive current Iop is increased.

In the above manner, a current which increases at a predetermined current varying rate can be supplied to the laser diode 11. However, since the voltage VB does not exceed the threshold voltage α (refer to α in FIG. 10) prior to the time b, the laser diode 11 does not perform any laser oscillation.

As shown with the time b in FIG. 10, when the output voltage VB of the operational amplifier 36 exceeds the threshold voltage α of the laser diode 11, or the monitoring voltage VA exceeds the voltage at the time b, the laser diode 11 starts its laser oscillation. Then till the voltage VA equalizes with the reference voltage Vref, the operational amplifier 36 increases its output voltage VB based on the time constant Tc mV/sec.

Sequentially, the following process will be made between the time b and the time c. With the laser oscillation of the laser diode 11, the current Im from the external photo diode 12 increases proportionally to the voltage Vcc and the light amount.

The voltage converted from the current Im by the variable resistor 37 and the operational amplifier 38 is divided to a voltage VA corresponding to the light amount to apply it to the negative input side of the amplifier 36 and the comparator 45. Naturally the voltage VA increases proportionally to the current Im.

However, since the voltage VA is lower than 90% of the reference voltage Vref between the time b and the time c, the resistor 40 is kept connected. As a result, in the span, the output VB of the operational amplifier 36 increases sequentially with the time constant of Tc mV/sec so that the laser output of the laser diode 11 increases with the LD drive current Iop in accordance with the time constant Tc mV/sec.

As indicates with the time c, when the voltage VA is equalized with the 90% of the reference voltage Vref, the comparator 45 produces an low (L) level signal to turn off the analog switch 39.

Since the resistor 40 is disconnected after the time c, the time constant is changed from the Tc mV/sec to Tc/100 mV/sec, the output voltage VB of the operational amplifier 36 varies with the time constant. At this time, the voltage VB is dropped to a value quite lower than the value that the laser diode 11 emits at a predetermined light amount p.

When the output voltage VB of the operational amplifier 36 rises in accordance with the time constant of Tc/100 mV/sec, the voltages VA and Vref applied respectively to the positive input side and the negative input side of the operational amplifier 36 are equalized to each other (refer to the time d in FIG. 10), whereby the output voltage VB of the operational amplifier 36 is maintained at a fixed value to emit a predetermined light amount p.

When the output voltage reaches the predetermined value, the operational amplifier 36 compensates with the time constant Tc/100 mV/sec so as to maintain the predetermined value with respect to the laser output variations due to various causes. Thus a laser output compensation can be performed at a moderate varying rate, instead of the higher rate compensation at the time constant of Tc mV/sec.

As a result, since the signal current sent to the base of the transistor 31 is at a fixed value, the LD drive current Iop is maintained to emit the light amount p. When the laser diode 11 is emitting in a predetermined light amount p with the reference voltage Vref, even if noise is induced in the feedback system due to a certain cause, the time constant is changed to a small value of the Tc/100 mV/sec near to the predetermined value producing the predetermined light amount p. Thus the output of the operational amplifier 36 does not fall sharply so that an abnormal light emission of the laser diode 11 can be prevented.

Since the time constant is Tc mV/sec while the predetermined light amount p is obtained, the output of the operational amplifier 36 can rise near to the predetermined light amount generating amount at a moderate rate. When the analog switch 34 is turned on in response to the control signal from the CPU, the operational amplifier 36 outputs the reference voltage Vref so that the transistor 31 is turned off to cut off the laser.

According to the first embodiment of the present invention, when the light amount of the laser diode 11 is less than a predetermined value, the first feedback control means with the resistor 40 selects the control mode, thus executing a feedback control of the light amount of the semiconductor laser with the first time constant. When the light amount of the laser diode 11 is more than a predetermined value, the second feedback control means without the resistor 40 selects the control mode, thus executing a feedback control of the light amount of the semiconductor laser 11 with the second time constant longer than the first time constant. Hence a feedback control can be performed in accordance with the light emitting amount of the laser diode 11. Such an effect can be established by adding a small device to the semiconductor laser control device, thus reducing the manufacturing cost.

(c) Explanation of the Second Embodiment

Figure 11:
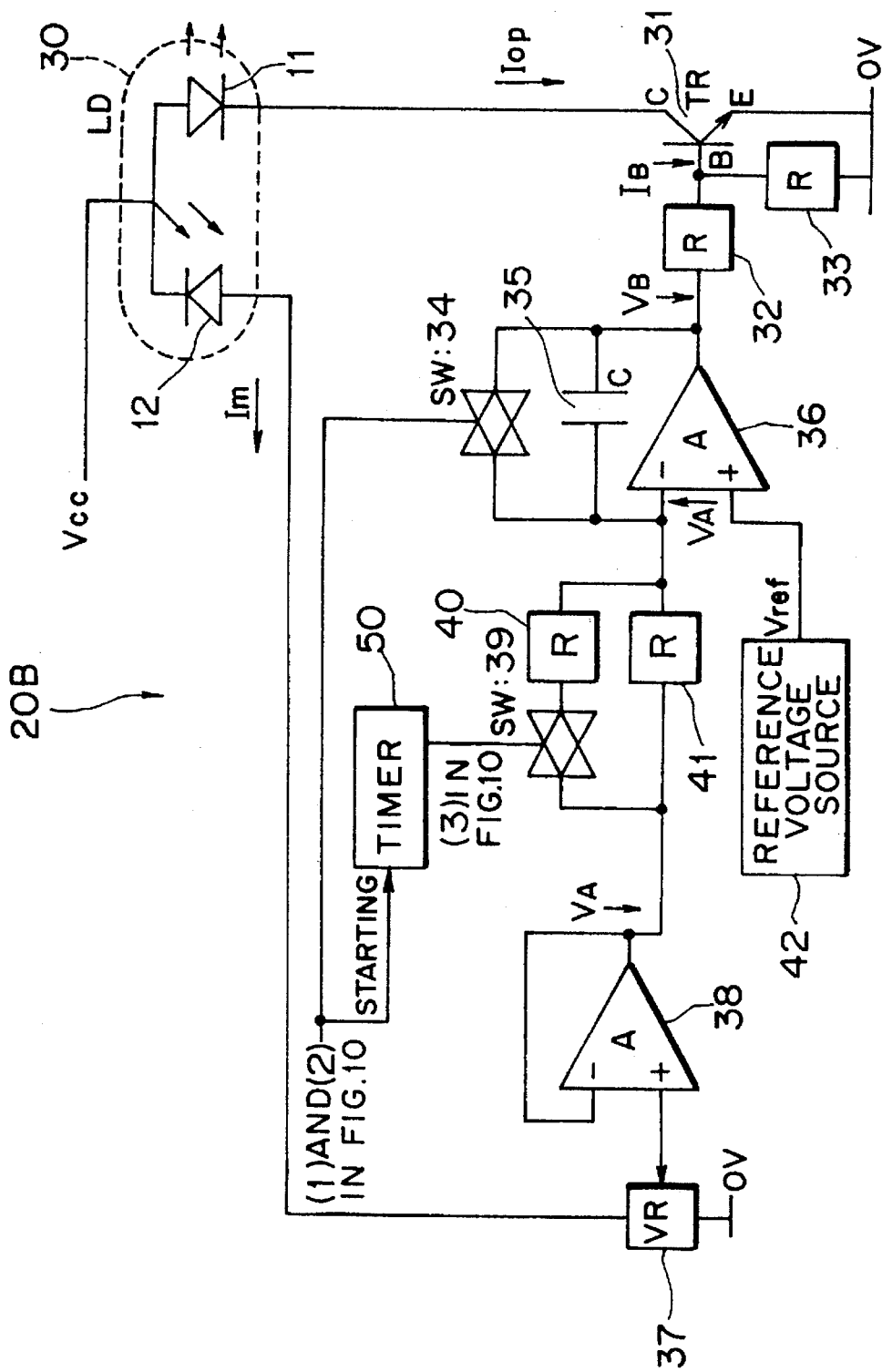
FIG. 11 is a circuit block diagram showing the second embodiment of the present invention.

FIG. 11 is a diagram showing the second embodiment of the present invention. In FIG. 11, numeral 20B represents a semiconductor laser control device. The semiconductor laser control device 20B can be arranged in place of the laser control devices 3 and 3A. The semiconductor laser control device 20B is constituted of an LD chip 30 including a laser diode 11 and a photo diode 12 arranged in parallel to each other, a transistor 31, analog switches 34 and 39, amplifiers 36 and 38, a reference voltage source 42, a capacitor 35, a variable resistor 37, resistors 32, 33, 40 and 41, and a timer 50.

In the devices, like numerals represent like elements in the semiconductor laser control device 20A in the first embodiment. The semiconductor laser control device 20B includes a timer 50 and an analog switch 34 which receive a control signal from a CPU, and an analog switch 39 connected to the CPU, instead of the comparator 45 as a control mode selecting means and the resistors 43 and 44.

When the CPU inputs an on/off control signal of an L level to the analog switch 34, the timer 50 activates and outputs an L level signal after a predetermined period of time c. The timer 50 receives an L level signal from the CPU and outputs an L level signal after the predetermined time c.

The predetermined time c, as shown in FIG. 10, is set so as to be longer than the time when the laser diode 11 produces a predetermined light amount of with the time constant of 1 mV/sec when the resistor 40 is added.

In such a structure, when the CPU sends an L level signal to the analog switch 34 and the timer 50, the semiconductor laser control device 20B activates while the timer 50 starts to count the predetermined time c.

As shown in FIG. 10, when the voltage VB applied the base of the transistor 31 exceeds the threshold voltage α, the LD drive current Iop sent to the semiconductor laser 11 emits the semiconductor laser 11.

While the timer 50 makes the analog switch 39 on for a predetermined period c of time, the resistor 40 is connected in parallel to the resistor 41.

During the period, when the control mode of the time constant of Tc mV/sec is selected, the output voltage VB of the operational amplifier 36 rises with the time constant (refer to the starting time a to the time c seen in FIG. 10). The feedback control of the light amount of the laser diode 11 is performed in accordance with the time constant of Tc mV/sec.

When the light amount is over the predetermined value q at the predetermined time c, the timer 50 outputs an L level signal to turn off the analog switch 39 so that the resistor 40 is disconnected from the resistor 41 connected in parallel thereto.

As a result, the control mode of the time constant of Tc/100 mV/sec is selected, the output voltage VB of the operational amplifier 36 rises with the time constant. The feedback control of the light amount of the laser diode 11 is performed in accordance with the time constant Tc/100 mV/sec (refer to the area after the time c seen in FIG. 10).

Then the operational amplifier 36 increases its output voltage VB at slow rate in accordance with the time constant of Tc/100 mV/sec. When the laser diode 11 reaches the predetermined light amount p, the voltage at that time is maintained. Various processes follow in the similar manner to the first embodiment.

When the analog switch 34 is turned on in accordance with the control signal from the CPU, the output signal of the operational amplifier 36 becomes the reference voltage Vref so that the transistor 31 is turned off to cut the laser light.

According to the second embodiment, the first time constant is switched to the second time constant at a predetermined time c longer than the predetermined light amount reaching time of the semiconductor laser 11 based on the first time constant Tc mV/sec. Hence the similar effect to that of the semiconductor laser control device 20A in the first embodiment can be obtained by a simplified structure where a small device is added merely to the semiconductor laser control device. This structure can reduce the manufacturing cost.

(d) Explanation of the Third Embodiment

Figure 12:
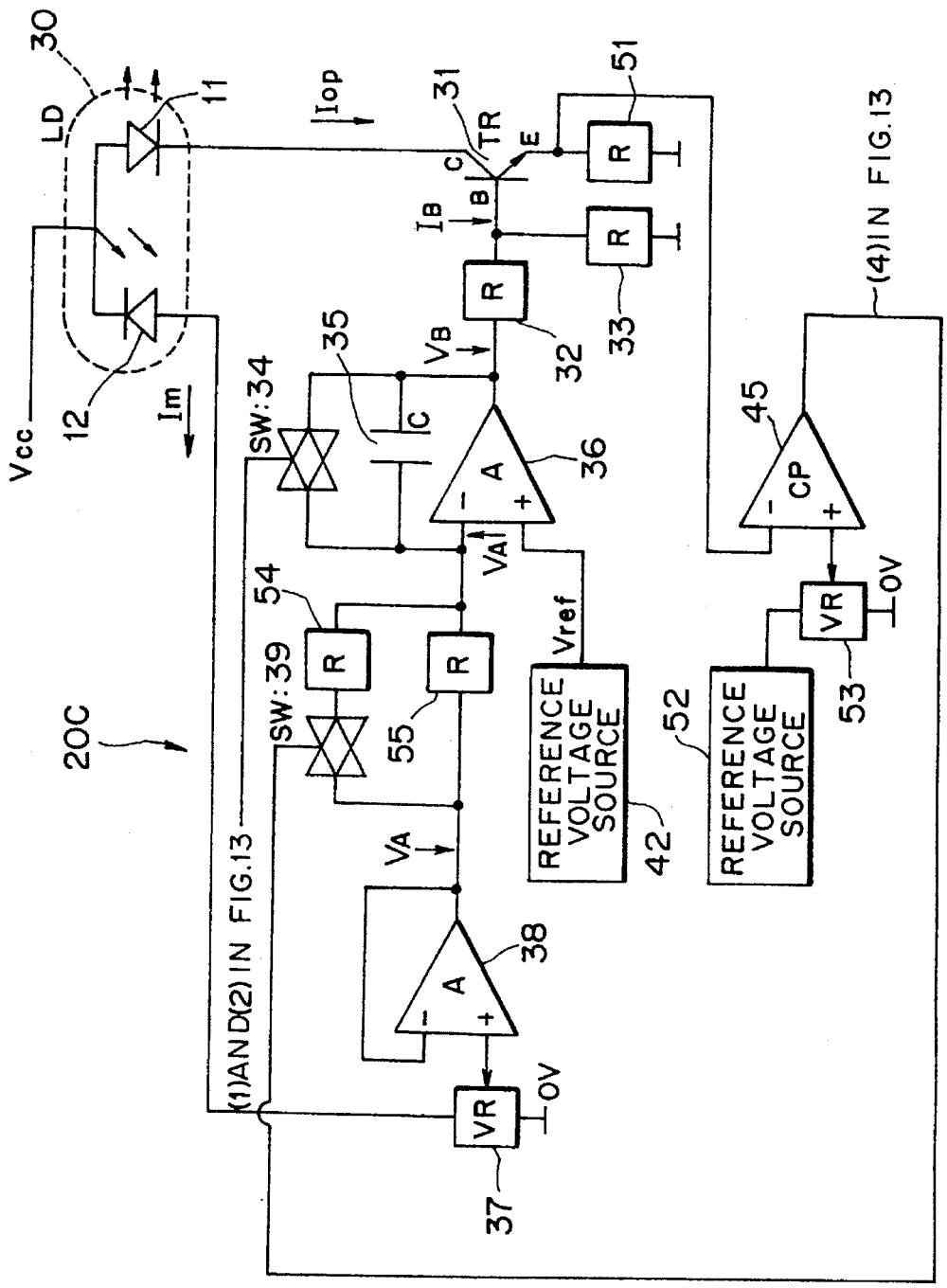
FIG. 12 is a circuit block diagram showing the third embodiment of the present invention.

FIG. 12 is a block diagram showing the third embodiment of the present invention. In FIG. 12, numeral 20C represents a semiconductor laser control device. The semiconductor laser control device 20C is arranged in place of the semiconductor laser control devices 3 and 3A. The semiconductor laser control device 20C is constituted of an LD chip 30 including a laser diode 11 and a photo diode 12 arranged in parallel, a transistor 31, analog switches 34 and 39, amplifiers 36 and 38, reference voltage sources 42 and 52, a capacitor 35, variable resistors 37 and 53, resistors 32, 33, 51, 54 and 55, and a comparator 45.

In those devices, like numerals represent elements forming the semiconductor laser control devices 20A and 20B in the first and second embodiments. The semiconductor laser control device 20C includes as a control mode selecting means a reference voltage source 52, a variable resistor 53, a comparator 45, and a resistor 51, instead of the timer 50 of the semiconductor laser control device 20B in the second embodiment. The resistors 54 and 55 are arranged in place of the resistors 40 and 41.

The comparator 45 has a positive input side receiving a voltage divided from the reference voltage Vref from the reference voltage source 52 by the variable resistor 53, and a negative input side receiving the emitter output of the transistor 31. The comparator 45 also has an output side connected to the analog switch 39. With the use of the reference voltage source 52, the variable resistor 53, and the resistor 51, the comparator 45 compares the voltage on the positive input with the voltage on the negative input. When the emitter output reaches a level which emits the collector output for producing a predetermined light amount r, the comparator 45 outputs an L level signal.

The predetermined light amount r is set to be slightly a lower value than the predetermined light amount p. In other words, the value (predetermined LD drive current value Iopr) at which the collector current (LD drive current Iop) produces the predetermined light amount r to the laser diode 11 is set to be a lower value slightly than the current value (predetermined LD drive current value Iopp) for producing a predetermined light amount p.

In the device 20C, the resistors 54 and 55 arranged in place of the resistors 40 and 41 are used to set the time constants of the outputs of the operational amplifier 36 to, for example, 10 Tc mV/sec or Tc/100 mV/sec. That is, when the resistor 54 is connected in parallel to the resistor 55, the time constant is 10 TcmV/sec. When the resistor 54 is disconnected from the resistor 55, the time constant is Tc/100 mV/sec.

In the semiconductor laser control device 20C, when the LD drive current Iop of the laser diode 11 is less than the predetermined drive current, the feedback of the light amount of the laser diode 11 is performed based on the first time constant of 10 Tc mV/sec. When the LD drive current Iop is more than the predetermined drive current, the feedback of the light amount of the laser diode 11 is performed based on the second time constant Tc100 mV/sec.

Figure 13:
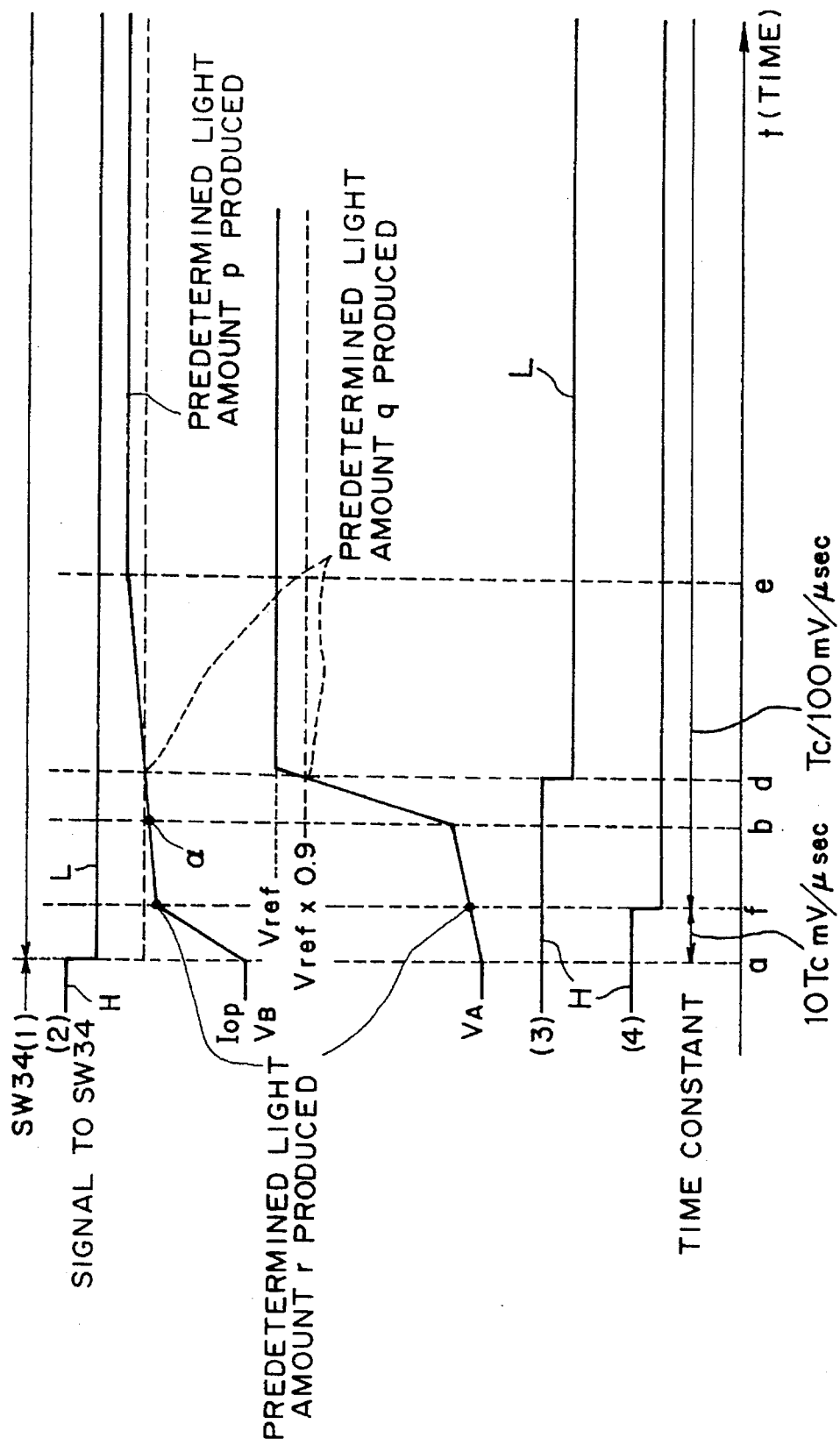
FIG. 13 is a block diagram showing the function of the third embodiment of the present invention.

In the above structure, as shown with (1) and (2) in FIG. 13, when the analog switch 34 is turned off in response to the control signal in the CPU, the current Im indicating a detected laser light amount is converted to a voltage and divided to the voltage VA corresponding to the light amount by means of the variable resistor 37.

Since the voltage VB applied to the base of the transistor 31 does not reach the emitter current value producing a predetermined light amount r prior to the time f, the comparator 45 outputs an H level signal. Thus the resistor 40 is connected to the resistor 41 in parallel. The output voltage VB of the operational amplifier 36 rises with the time constant of 10 Tc mV/sec by the time f.

With the increase in the base voltage VB of the transistor 31, when the time f has come, the emitter current and the collector current reach respectively a value producing the predetermined light amount r.

As a result, the comparator 45 outputs an L level signal to the analog switch 139 to disconnect the resistor 40 from the resistor 41. After the time f, the output voltage VB of the operational amplifier 36 rises with the time constant of Tc/100 mV/sec.

When the output voltage VB of the operational amplifier 36 exceeds the threshold voltage α of the laser diode 11 at the time b, the laser diode 11 starts its laser oscillation.

Then the operational amplifier 36 increases slowly the voltage VB in accordance with the time constant Tc/100 mV/sec. The operational amplifier 36 maintains the voltage when the light amount of the laser diode 11 reaches at a predetermined value p at the time e. Various processes follows sequentially in the similar manner to the first embodiment.

When the analog switch 34 is turned on in accordance with the control signal from the CPU, the output of the operational amplifier 36 becomes the reference voltage Vref so that the transistor 31 is turned off to cut the laser emission.

As described above, when the drive current of the laser diode 11 reaches a predetermined value, the first time constant of 10 TcmV/sec is switched to the second time constant of Tc/100 mV/sec. Thus arranging merely a small device to the laser control device causes the similar effect to that in the semiconductor laser control device 20A in the first embodiment.

Moreover, since the LD drive current Iop of the semiconductor laser 11 is directly measured, if an abnormal state occurs in the main feedback system, the time constant can be switched at an exact timing operation.

Moreover after the power source is switched on, the LD drive current Iop can be increased swiftly near to the value producing a predetermined light amount p in accordance with a curve of the second order characteristic.

(e) Explanation of the Fourth Embodiment

Figure 14:
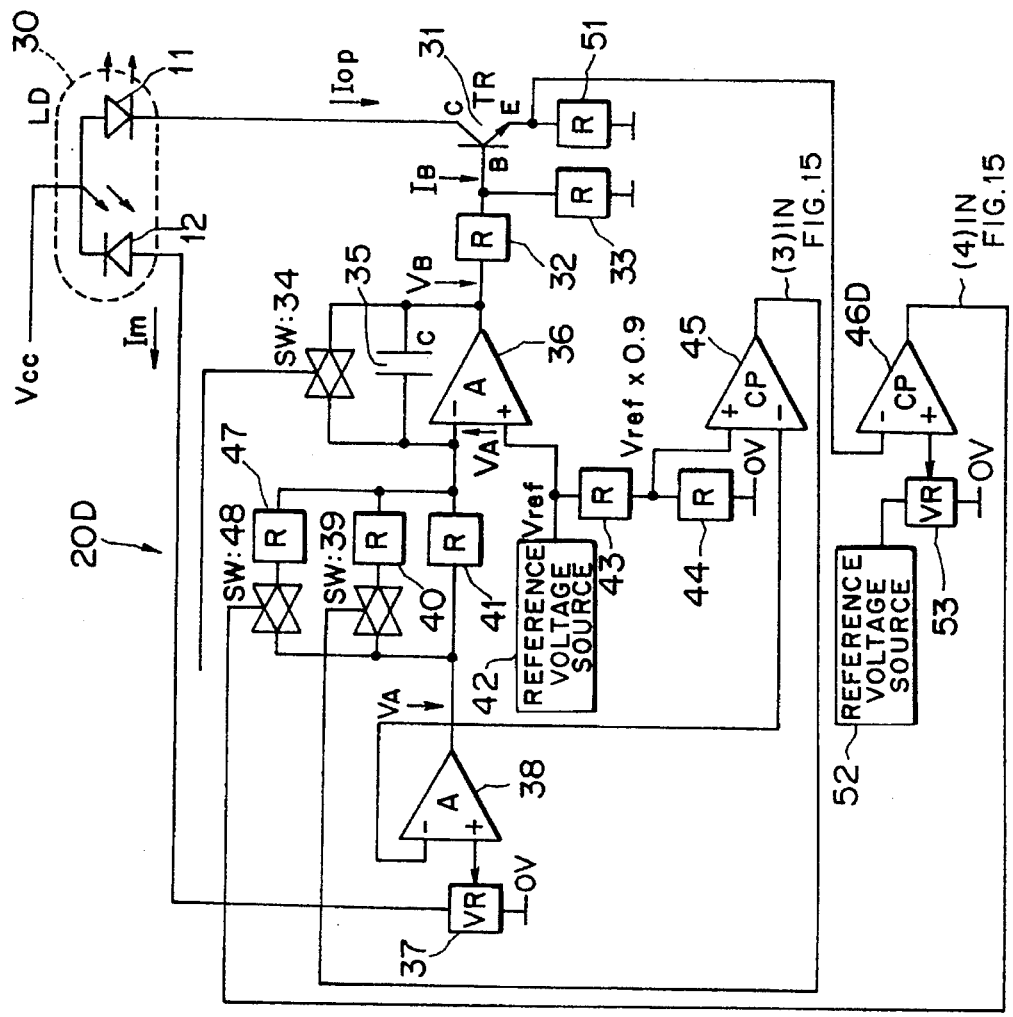
FIG. 14 is a circuit block diagram showing the fourth embodiment of the present invention.

FIG. 14 is a block diagram showing the fourth embodiment of the present invention. In FIG. 14, numeral 20D represents a semiconductor laser control device. The semiconductor laser control device 20D is arranged in place of the semiconductor laser control devices 3 and 3A. The semiconductor laser control device 20D is constituted of an LD chip 30 including a laser diode 11 and a photo diode 12 arranged in parallel to each other, a transistor 31, analog switches 34, 39 and 48, amplifiers 36 and 38, reference voltage sources 42, and 52, a capacitor 35, variable resistors 37 and 53, resistors 32, 33, 41, 43, 44, 47, 51, 54 and 55, and comparators 45 and 46D.

In the semiconductor laser control devices 20A, 20B and 20C according to the first, second, and third embodiments, like numerals represent like elements. The semiconductor laser control device 20D includes additionally the reference voltage source 52, the variable resistor 53, the comparator 45, and the resistor 51 which act as the control mode selecting means in the semiconductor laser control-device 20C of the third embodiment in the semiconductor laser control device 20C, to the semiconductor laser control device 20A of the first embodiment.

In the previous embodiments, the resistor 47 is connected in parallel to the resistors 40 and 41 and the analog switch 34 functioning as the first and second feedback control means. The resistor 47 is connected serially to the switch 48. The switch 48 is connected so as to be controlled on/off in response to the output from the comparator 46D.

The resistor 47 has the same value as that of the resistor 41. The analog switch 48 is made of the same types as the analog switches 34 and 39, and the comparator 46D is the same type as the comparator 45.

The resistors 40, 41, and 47 are used to adjust the time constant of the output of the operational amplifier 36 in the device 20D to 10 Tc mV/sec (first time constant), Tc mV/sec (second time constant), or Tc/100 mV/sec (third time constant). When the resistors 40 and 47 are connected in parallel to the resistor 41, they act as the first feedback control means with the time constant of 10 TcmV/sec. When the resistor 47 is disconnected from the analog switch 48 and the resistor 40 is connected in parallel to the resistor 41, they act as the second feedback control means with time constant of Tc mV/sec. When the analog switches 39 and 48 disconnect respectively the resistors 40 and 47 from the resistor 41, the structure functions as the third feedback control means with the time constant of Tc/100 mV/sec. As described above, the third time constant is set to be longer than the second time constant. The second time constant is so as to be longer than the first time constant.

The comparators 45 and 46D for selecting the resistors 40, 41 and 47, and various devices act as drive current measuring means and control mode selecting means. That is, when the LD drive current Iopr is less than a predetermined value based on the LD drive current Iop and the drive current measuring result, the first feedback means selects a control mode. When the LD drive current Iopr is more than the predetermined value, the second feedback control means selects the control mode. When the light amount of the laser diode 11 is larger than the predetermined light amount q, the third feedback control means selects the control mode.

As described in the third embodiment, the collector current (predetermined LD drive current value Iopr) of the transistor 31 producing a predetermined light amount r is set to a lower value slightly than the collector current (predetermined LD drive current value Iopr) producing a predetermined light amount p.

Figure 15:
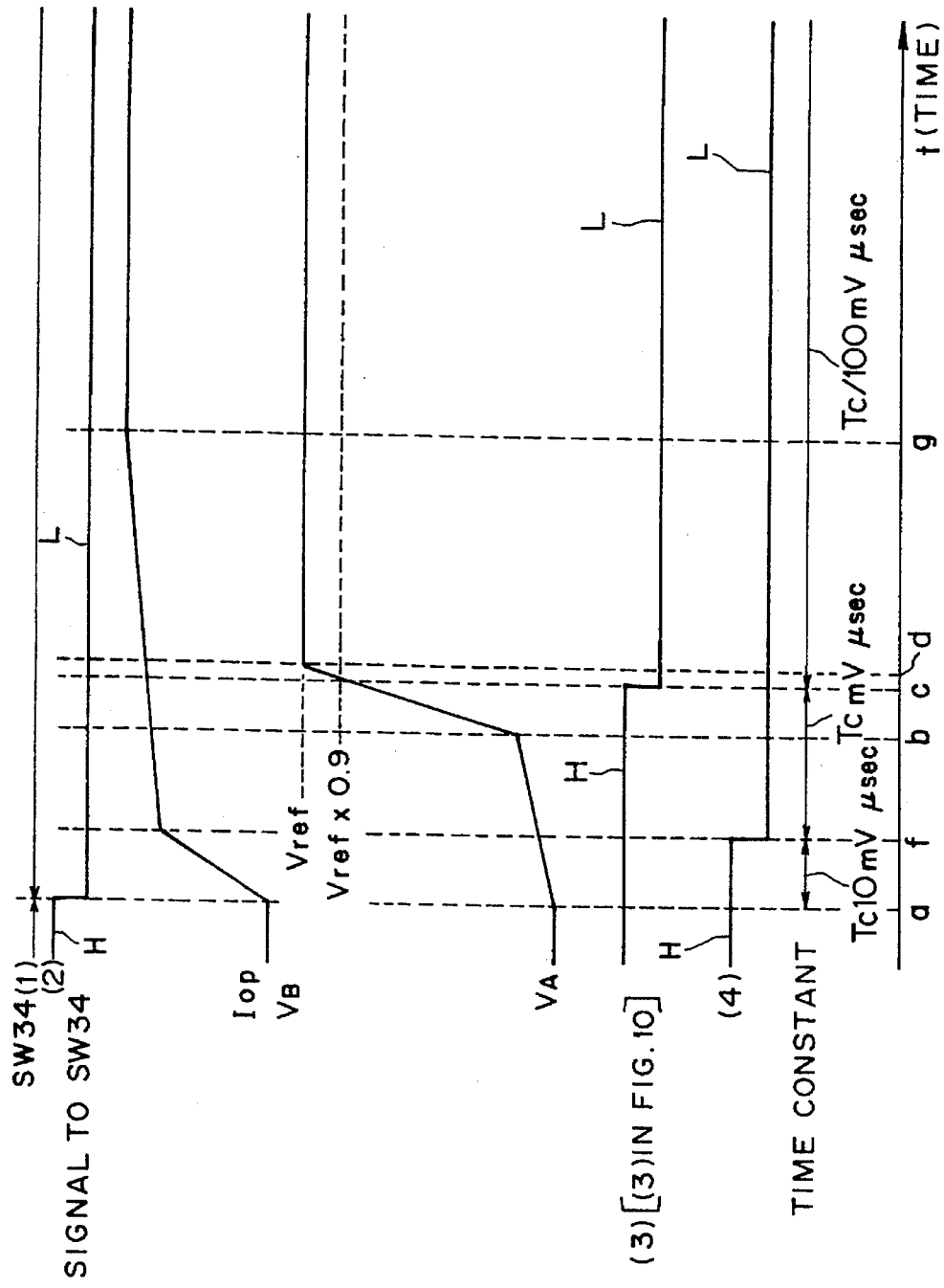
FIG. 15 is a block diagram showing the function of the fourth embodiment of the present invention.

In the above structure, as shown with (1) and (2) in FIG. 15, the analog switch 34 is turned off in response to the control signal from the CPU, the current Im indicating the detected laser light amount is converted to a voltage and divided to a voltage VA corresponding to the light amount by means of the variable resistor 37.

When the LD drive current Iop of the semiconductor laser 11 which produces in accordance with the base voltage VB of the transistor 31 till the time f is less than a predetermined value, and is less than a predetermined value, the first feedback control means selects the control mode. That is, since the feedback control of the light amount of the laser diode 11 is performed based on the first time constant of 10 Tc mV/sec, the output voltage VB of the operational amplifier 36 rises according to the first time constant.

With the increase of the voltage VB at the time f, the LD drive current Iop through the emitter reaches at a predetermined drive current value Iopr. Then since the comparator 46D outputs the L level signal to the analog switch 48, the resistor 47 connected in parallel to the resistors 40 and 41 is disconnected. Thus the second feedback control means selects the control mode so that the voltage VB rises in accordance with the time constant Tc mV/sec.

Then when the output voltage VB of the operational amplifier 36 exceeds the threshold value α of the laser diode 11 at the time b, the laser diode 11 oscillates.

At the time c, since the base voltage of the transistor 31 rises with the voltage VB, the collector current and the emitter current reach respectively at a predetermined value producing a predetermined light amount q.

As a result, the voltage VA on the negative input of the comparator 45 is equalized with 90% of the reference voltage Vref so that the comparator 45 outputs an L level signal to the analog switch 39.

Thus when the resistor 40 connected in parallel to the resistor 41 is disconnected, the output voltage of the operational amplifier 36 rises in accordance with the third time constant Tc/100 mV/sec after the time c. In other words, when light amount q exceeds the predetermined value, the third feedback control means selects the control mode.

Then the operational amplifier 36 raises slowly its output voltage VB based on the time constant of Tc/100 mV/sec. When the laser diode 11 emits at the predetermined light amount p at the time g, the voltage is maintained. Various processes follow sequentially in the similar manner to that of the first embodiment.

When the analog switch 34 is turned on in response to the control signal from the CPU, the output of the operational amplifier 36 becomes the reference voltage Vref, thus turning off the transistor 31 to glow off the laser. FIG. 15 does not show the voltage VB because it resembles nearly the voltage VA.

As described above, when the drive current of the laser diode 11 reaches a predetermined value Iopr, the control mode is switched from the first time constant of 10 Tc mV/sec to the second time constant of Tc mV/sec. Furthermore, when the light amount reaches a predetermined value q, the control mode is switched from the second time constant of Tc mV/sec to the third time constant of Tc/100 mV/sec. Hence the similar effect to that of the semiconductor laser control device 20A according to the first and third embodiments can be established by adding merely a small device to the semiconductor laser control device. In comparison with the third embodiment, the LD drive current Iop can be increased near to a value producing the light amount p at earlier rate after the power source is switched on.

(f) Explanation of the Fifth Embodiment

Figure 16:
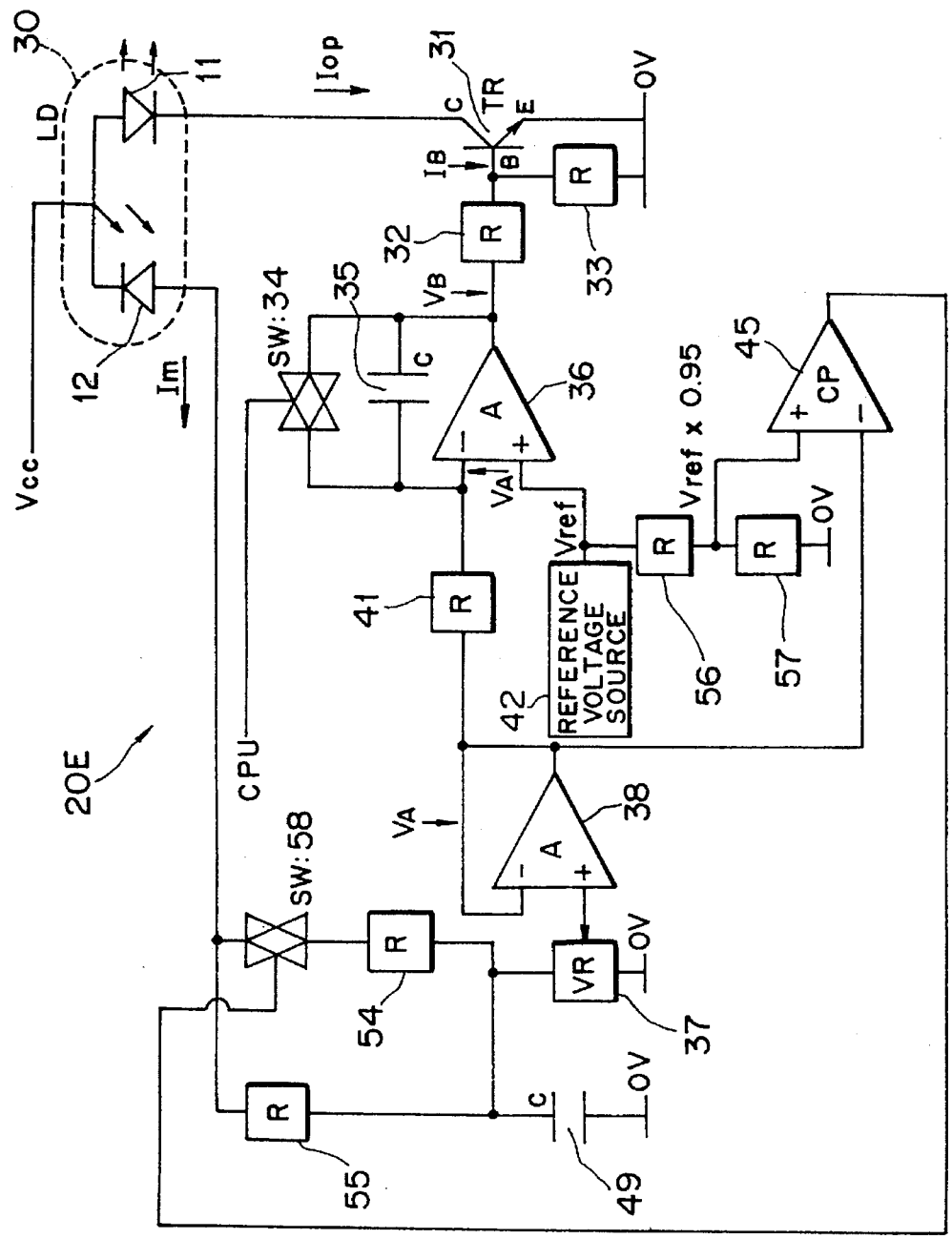
FIG. 16 is a circuit block diagram showing the fifth embodiment of the present invention.

FIG. 16 is a block diagram showing the fifth embodiment according to the present invention. In FIG. 16, numeral 20E represents a semiconductor laser control device. The semiconductor laser control device 20E is arranged in place of the semiconductor laser control devices 3 and 3A. The semiconductor laser control device 20E is constituted of an LD chip 30 including a laser diode 11 and a photo diode 12 arranged in parallel to each other, a transistor 31, analog switches 34 and 58, amplifiers 36 and 38, reference voltage power source 42, capacitors 35 and 49, a comparator 45, a variable resistor 37, and resistors 32, 33, 41, 54, 55, 56, and 57.

In the above devices, like numerals represent like elements in the semiconductor laser control devices 20A, 20B, 20C, and 20D of the first, second, third, and fourth embodiments. The semiconductor laser control device 20E includes an analog switch 58, resistors 54 and 55, and a capacitor 49, instead of the resistor 40 and the analog switch 39 in the semiconductor laser control device 20A in the first embodiment.

The resistor 54 has an current input side connected to the external photo diode 12 via the analog switch 58, and an output side connected to the variable resistor 37 and the capacitor 49. The resistor 55 is connected in parallel to a serial circuit of the analog switch 58 and the resistor 54, and also is connected to the capacitor 49.

The above circuit structure acts as a low pass filter which passes the low frequency component in the monitoring current Im from the external photo diode 12. When the analog switch 58 is turned on in response to the L level signal, the above structure is connected as a low pass filter to the feedback system (feedback control means) to input the monitoring signal (voltage VA) from the external photo diode 12. Thus the operational amplifier 36 is controlled so as to moderate its output voltage variation.

The comparator 45 acts as a selecting means. When the light amount of the laser diode 11 obtained based on the monitoring result from the external photo diode 12 exceeds the predetermined value s, the comparator 45 outputs an L level signal. The predetermined light amount s is somehow lower than the predetermined light amount p.

In such a structure, as shown with (1) in FIG. 16, when the analog switch 34 is turned off in response to the control signal from the CPU, the current Im indicating the laser light amount detected is converted to a voltage and divided to a voltage VA corresponding to the light amount. In this case, the analog switch 58 is in off state, thus passing no current Im through the resistor 54.

The reason is that the light amount of the laser diode 11 is not at the predetermined value s immediately after the power source is switched on while the comparator 45 outputs an H level signal because the current Im is less than the predetermined light amount s corresponding to 90% of the reference voltage Vref.

That is, the light amount of the laser diode 11 is subjected to a feedback control with the shorter time constant till the light amount reaches the predetermined value s so that the output voltage VB of the operational amplifier 36 rises in accordance with the time constant.

When the light amount reaches the predetermined value s, the current Im exceeds a value corresponding to the 95% of the reference voltage Vref corresponding to the predetermined light amount s so that the comparator 45 outputs an L level signal.

Then the analog switch 58 is turned on and the current Im flows through the resistor 54 connected in parallel to the resistor 55. As a result, a low pass filter is formed together with the capacitor 49 and delays the feedback system by transmitting the low frequency component of the current Im to the feedback system.

In order to control the light amount of the laser diode 11, the output voltage VB of the operational amplifier 36 is subjected to a feedback control from a slight smaller value of the predetermined light amount p, based on the time constant longer than the above time constant. Sequentially various processes follow in the similar manner to that in the first embodiment.

When the analog switch 34 turned on in response to the control signal from the CPU, the output voltage of an operational amplifier 36 becomes the reference voltage Vref while the transistor 31 is turned off to cut the laser emission.

The similar effect to that in the semiconductor laser diode 20A according to the first embodiment can be obtained by connecting or disconnecting the low pass filter based on the predetermined light amount s as a threshold value. Unlike the first embodiment, the feedback system has a time constant varying component arranged to the input side of the operational amplifier 38. Hence the flexibility in the design of the semiconductor laser control device is widen like the first embodiment.

(g) Explanation of the Sixth Embodiment

Figure 17:
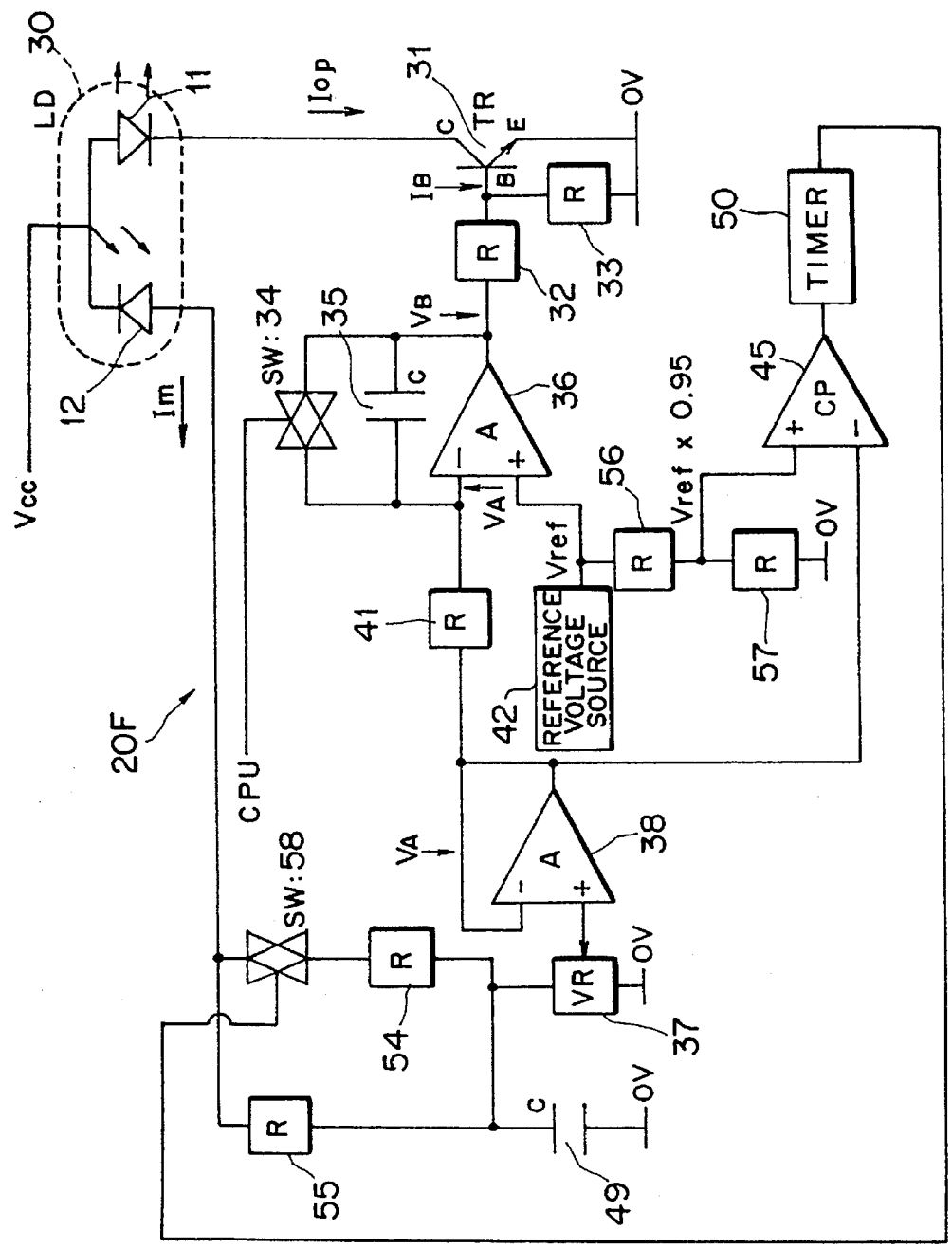
FIG. 17 is a circuit block diagram showing the sixth embodiment of the present invention.

FIG. 17 is a block diagram showing the sixth embodiment according to the present invention. In FIG. 17, numeral 20F represents a semiconductor laser control device. The semiconductor laser control device 20F is arranged in place of the semiconductor laser control devices 3 and 3A. The semiconductor laser control device 20F includes a timer 50 arranged between the output of the comparator 45 and the analog switch 58 in the semiconductor laser control device 20E of the fifth embodiment.

The timer 50 is similar to that of the second embodiment. Particularly, in this case, the timer 50 activates when the received signal is an L level signal. When a period u of time previously registered and predetermined has passed, the timer itself produces an L level signal.

The total period obtained by adding the predetermined period u to the period between the time that the analog switch 34 has been turned off and the time that the light amount s is established is set so as to be shorter slightly than the period between the time that the analog switch 34 has been turned off and the time that the laser diode 11 emits at the predetermined light amount p.

The comparator 45 inputs the monitoring signal from the external photo diode 12 to the feedback system through the low pass filter based on the monitoring result (current Im) from the external photo diode 12 and after a lapse of the predetermined time u from the time that the light amount is more than the predetermined value s.

In the above structure, the comparator 45 controls a feedback of the light amount of the laser diode 11 with a shorter time constant based on the monitoring result from the external photo diode 12 and within the predetermined time u after the light amount has been more than the predetermined value s.

When the predetermined time u passes after the light amount of the laser diode 11 has exceeded the predetermined value s, the comparator 45 distributes the current Im to the low pass filter forming elements.

The low frequency component of the current Im is sent to delay the feedback system. As a result, the output voltage VB of the operational amplifier 36 controls the light amount of the laser diode 11 with a time constant longer than the previous time constant and from the value smaller than the predetermined light amount p. The time constant switching timing can change arbitrarily by varying the predetermined time u registered by the timer 50. Since the switching timing is considered in the time reaching the predetermined light amount s, the timer 50 can control with no time deviation to the predetermined time and high reliability. Sequentially, various processes follow in the similar manner to that in the first embodiment.

(h) Explanation of the Seventh Embodiment

Figure 18:
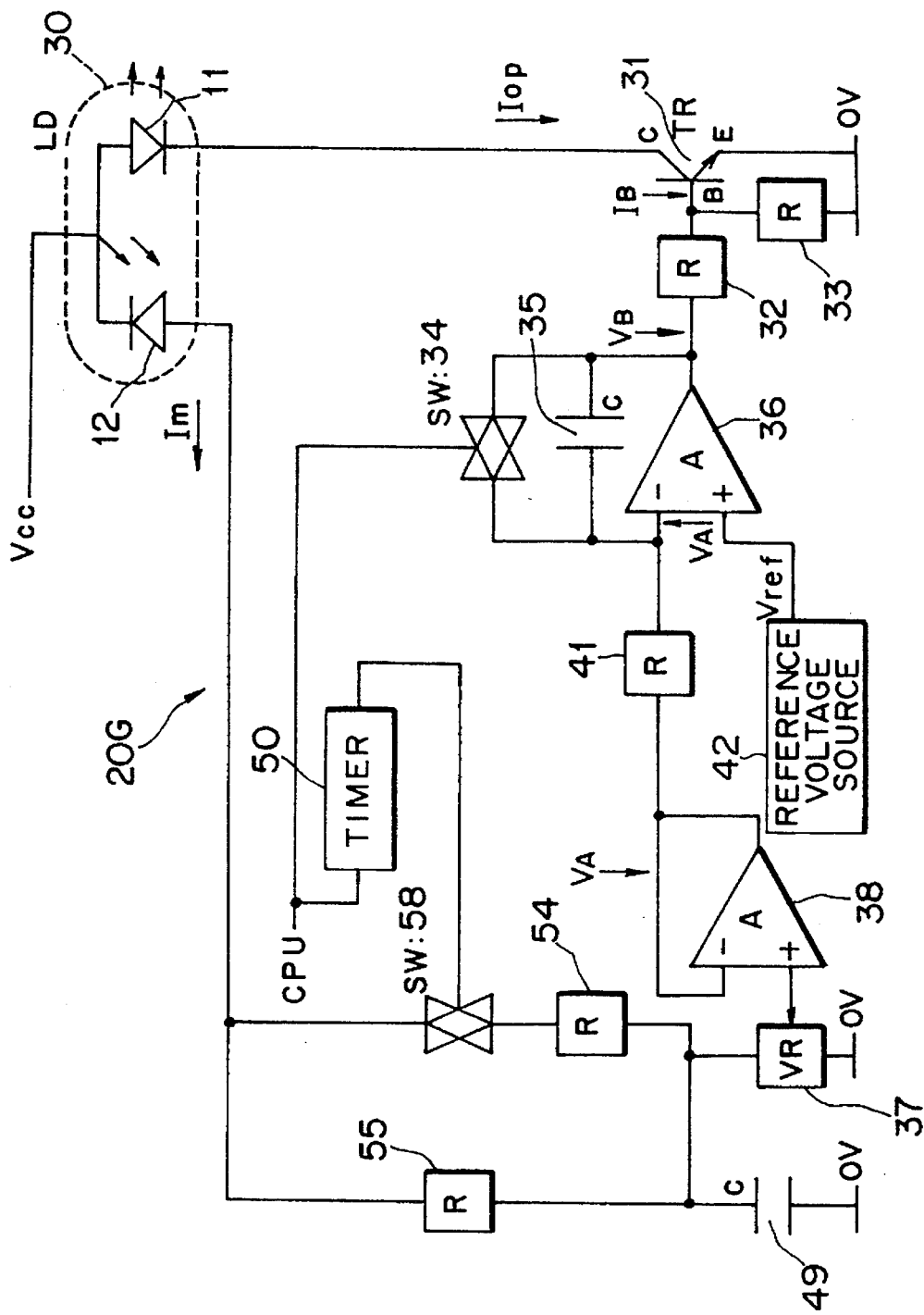
FIG. 18 is a circuit block diagram showing the seventh embodiment of the present invention.

FIG. 18 is a block diagram showing the seventh embodiment according to the present invention, In FIG. 18, numeral 20G represents a semiconductor laser control device. The semiconductor laser control device 20G is arranged in place of the semiconductor laser control devices 3 and 3A. The semiconductor laser control device 20G is constituted of an LD chip 30 including a laser diode 11 and a photo diode 12 arranged in parallel to each other, a transistor 31, analog switches 34 and 58, amplifiers 36 and 38, a reference potential source 42, capacitors 35 and 49, a variable resistor 37, a timer 50, and resistors 32, 33, 41, 54, and 55.

In the above devices, like numerals represent like elements forming the semiconductor laser control devices 20A, 20B, 20C, and 20D of the first, second, third, fourth, fifth, and sixth embodiments. That is, the semiconductor laser control device 20G includes a timer 50 for receiving the output of the CPU, in place of the resistors 56 and 57 and the comparator 45 in the fifth embodiment of the present invention. The output of the timer 50 is connected so as to control the analog switch 58.

The timer 50 is one similar to that used in the previous embodiment. Particularly, in this case, when the preregistered and predetermined period v of time has passed, the timer 50 is set to output an L level signal.

The predetermined period v is set so as to be shorter slightly than the period of time taken from the time that the analog switch 34 is turned off to the time that the laser diode 11 emits at the predetermined light amount p.

Like the semiconductor laser control device 20E in the fifth embodiment, when the analog switch 58 is turned on in response to the L level signal from the timer 50, it inputs the monitoring signal (current Im) from the external photo diode 12 to the feedback system via the low pass filter.

In the above structure, when the predetermined period v is passed after the laser diode 11 has been changed from an off state to an on state, the current Im is inputted to the feedback system via the low pass filter forming elements by means of the timer 50 and the analog switch 58.

As a result, the time constant is changed, for example, from TcmV/sec to Tc/100 mV/sec at a value near to the predetermined light amount p so that the output voltage of the operational amplifier 36 is subjected to a proper feedback control near to or at the predetermined light amount p.

Even a small circuit structure can vary arbitrarily the time constant switching timing by varying the predetermined time v registered in the timer 50. Sequentially various operations follow further in the similar manner to that in the first embodiment.

(i) Explanation of the Eighth Embodiment

Figure 19:
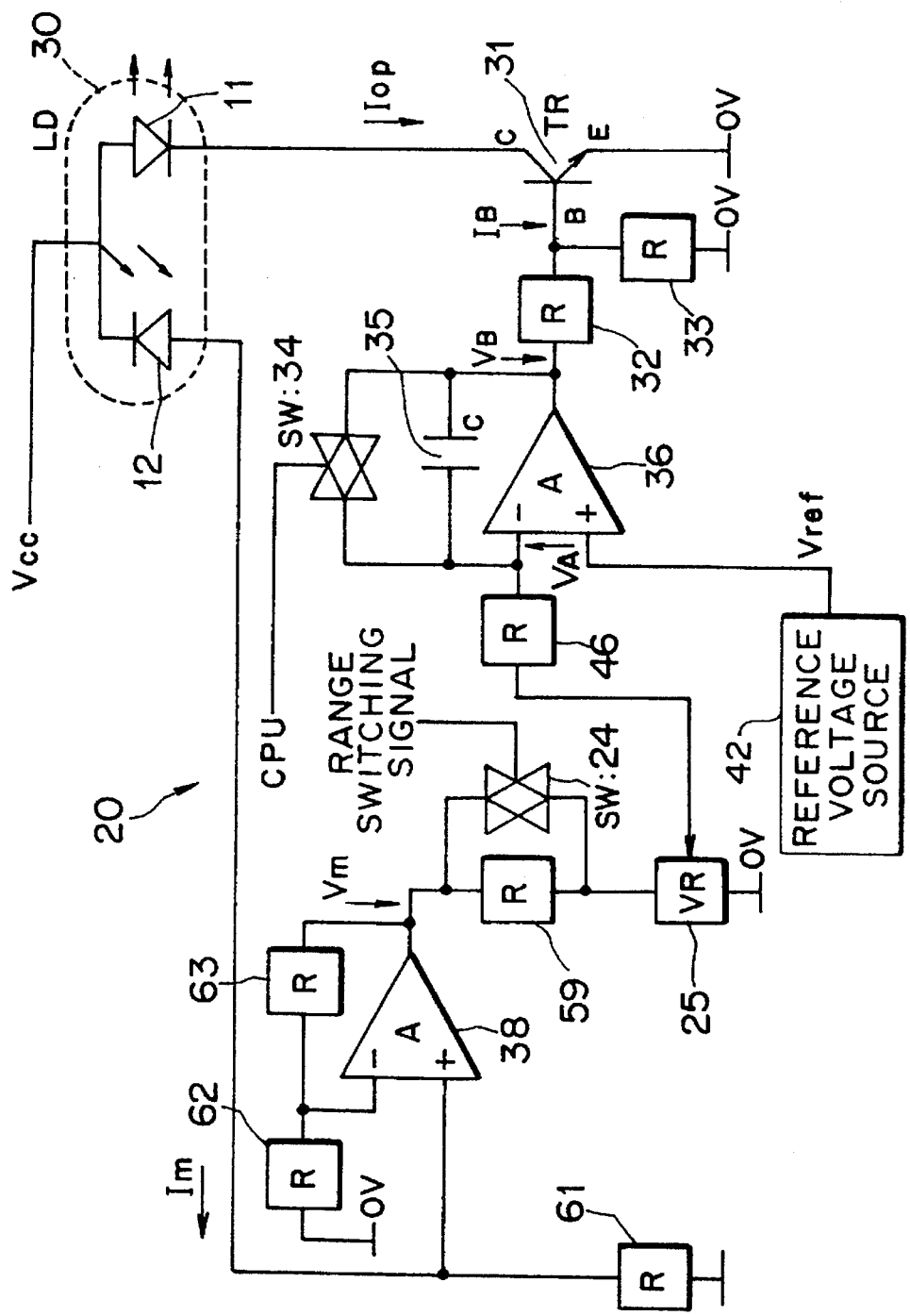
FIG. 19 is a circuit block diagram showing the eighth embodiment of the present invention.

FIG. 19 is a block diagram showing the eighth embodiment according to the present invention. In FIG. 19, numeral 20 represents a semiconductor laser control device. The semiconductor laser control device 20 is arranged in place of the semiconductor laser control devices 3 and 3A. The semiconductor laser control device 20 also includes an LD chip 30 including a laser diode 11 and a photo diode 12 arranged in parallel to each other, a transistor 31, an analog switch 34, a capacitor 35, amplifiers 36 and 38, a reference voltage source 42, resistors 32, 33 and 46, resistors 61, 62, and 63 acting as a current/voltage converter, an analog switch 24 acting as a monitoring voltage dividing means, a resistor 59, and a variable resistor 25. The operational amplifier 36 acts as feedback control means.

In the above devices, like numerals represent like elements in the semiconductor laser control device in each embodiment. That is, in the semiconductor laser control device 20, the resistor 59 is arranged between the operational amplifier 38 and the variable resistor 25 in the semiconductor laser control device 3A described above. The analog switch 24 is connected in parallel to the resistor 59.

Figure 26:
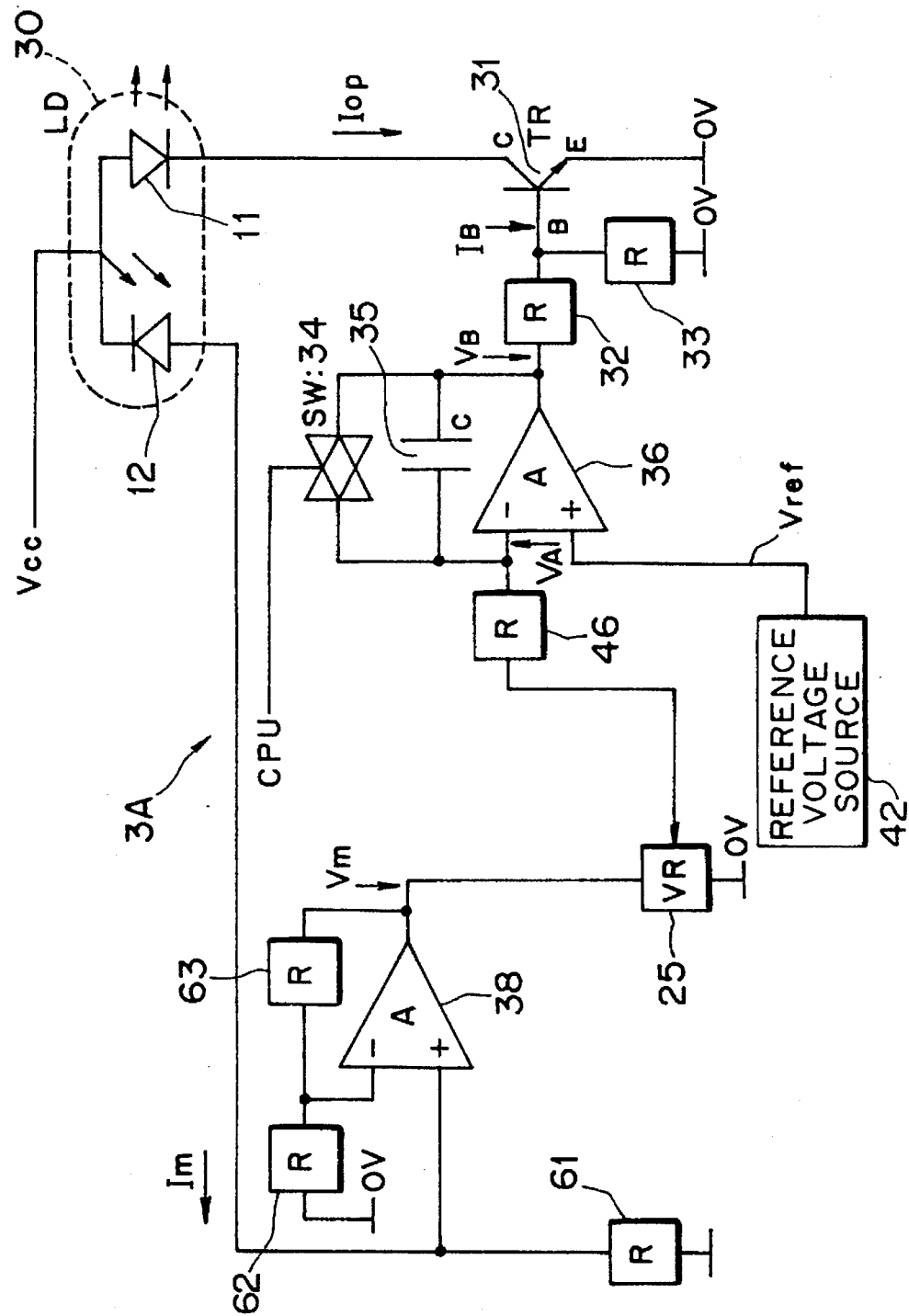
FIG. 26 is a circuit block diagram showing another semiconductor laser control device.

As described with the device shown in FIG. 26, the circuit configuration of the resistors 61, 62, and 63 converts the current Im flowing the positive and the negative inputs sides of the operational amplifier 38 to a voltage divided in a predetermined ratio.

Since the operational amplifier 36 has the negative input side connected to no time constant varying resistor, it integrates the output voltage with the time constant determined by the resistor 46 and maintains it at a predetermined value.

The analog switch 24 is turned on or off in accordance with an external control and short-circuits the resistor 59 connected in parallel thereto. The resistor 59 drops the voltage Vm from the operational amplifier 38 in a predetermined ratio when the analog switch 24 is turned off. The resistance value of the resistor 59 is set not to emit excessively the light emitting diode 11 without depending the on/off state of the analog switch 24 when the variable resistor 25 is adjusted to its minimum resistance value and the current Im at the minimum value flows. The variable resistor 25, as described with the device in FIG. 26, varies continuously the voltage dividing ratio.

Figure 25:
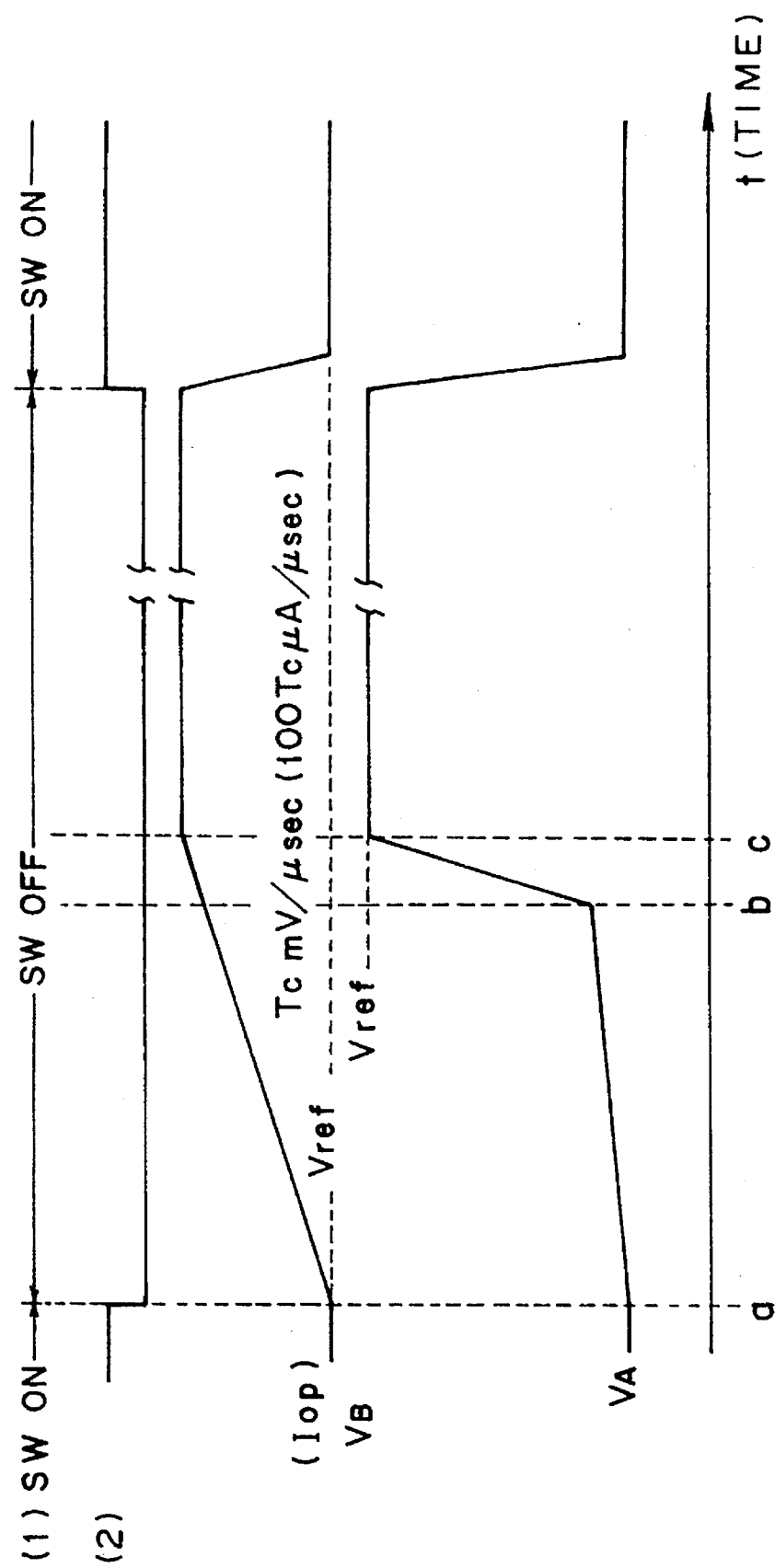
FIG. 25 is a block diagram showing the function of the semiconductor laser control device.

The above structure, as shown in FIG. 19, executes in the similar manner to that in the prior art. That is, the external photo diode 12 detects the current Im indicating the laser light amount. As shown in FIG. 25, the operational amplifier 36 equalizes the voltage VA corresponding to the current Im with the reference voltage Vref and subjects the LD drive current Iop of the semiconductor laser 11 to a feedback control to maintain the laser light amount at a fixed value.

The laser diode 11 and the external photo diode 12 on the LD chip 30 may be of the same type in the mounting condition. In this case, the current Im to the light amount of the laser diode 11 may vary but the voltage to the negative input side of the operational amplifier 36 can be compensated to a proper value by dividing the voltage by the variable resistor 25.

Figure 20:
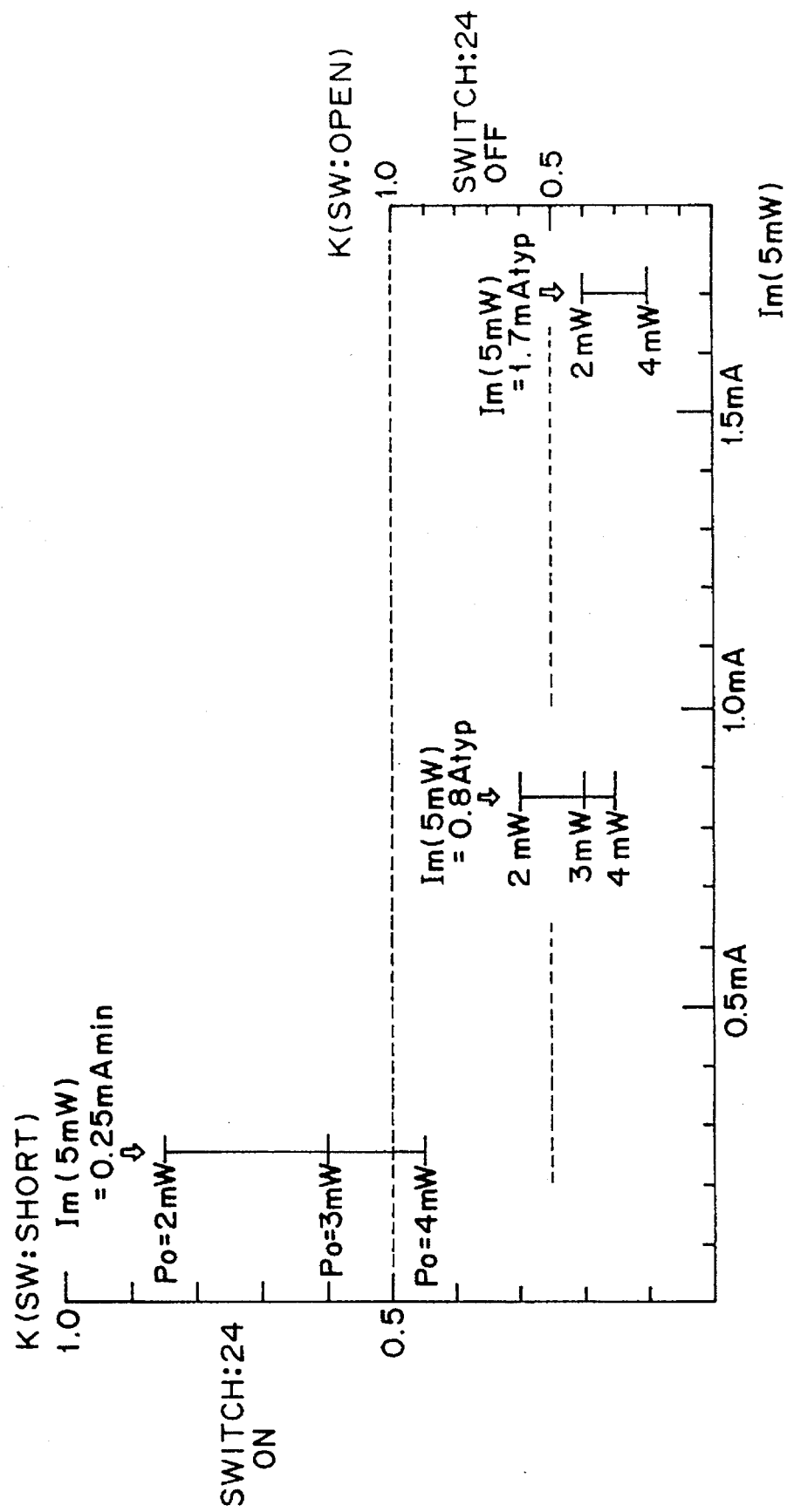
FIG. 20 is a diagram explaining the function of the eighth embodiment of the present invention.
Figure 27:
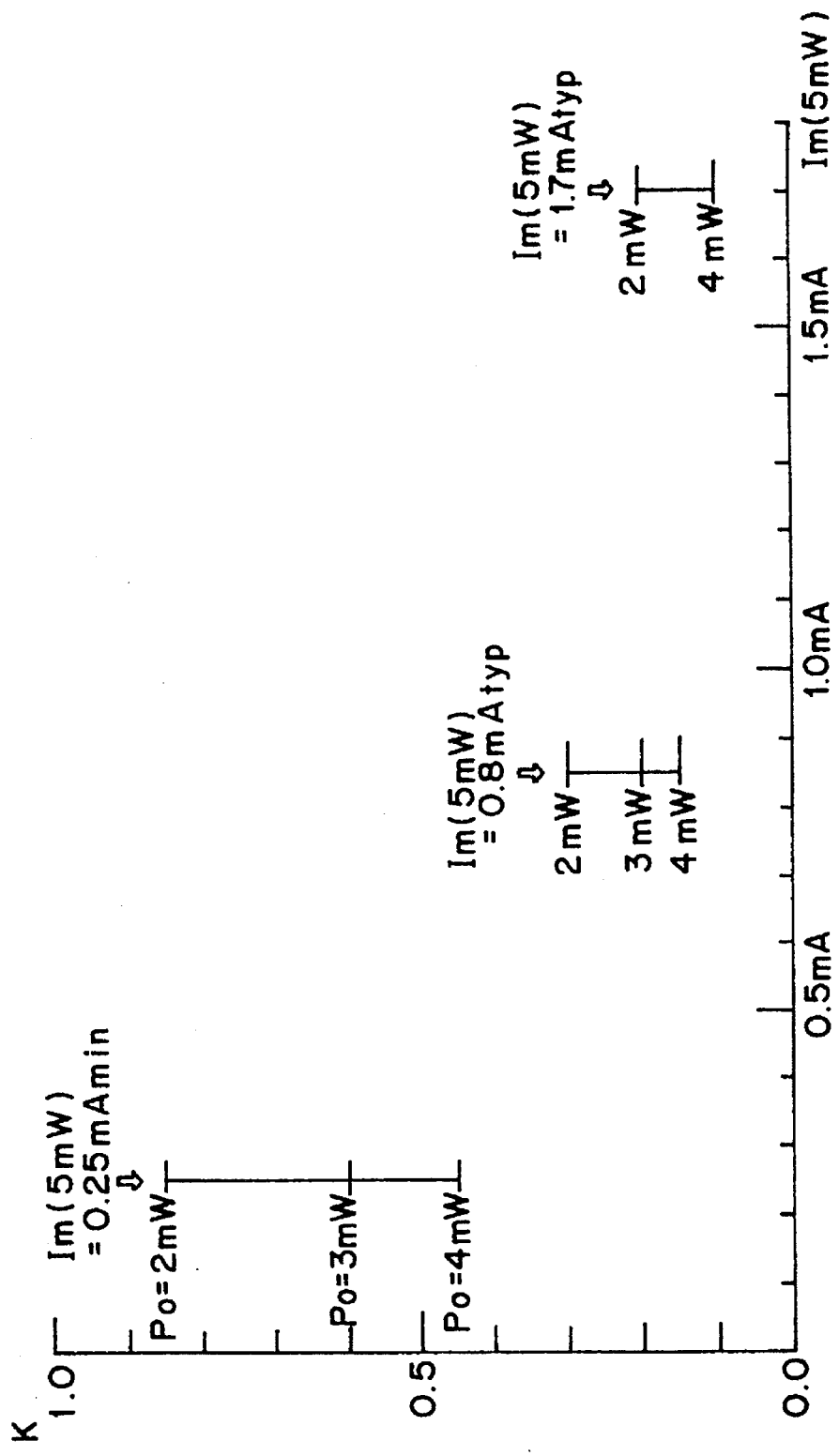
FIG. 27 is a block diagram showing the voltage division ratio vs current characteristic of a semiconductor laser control device.
Figure 28:
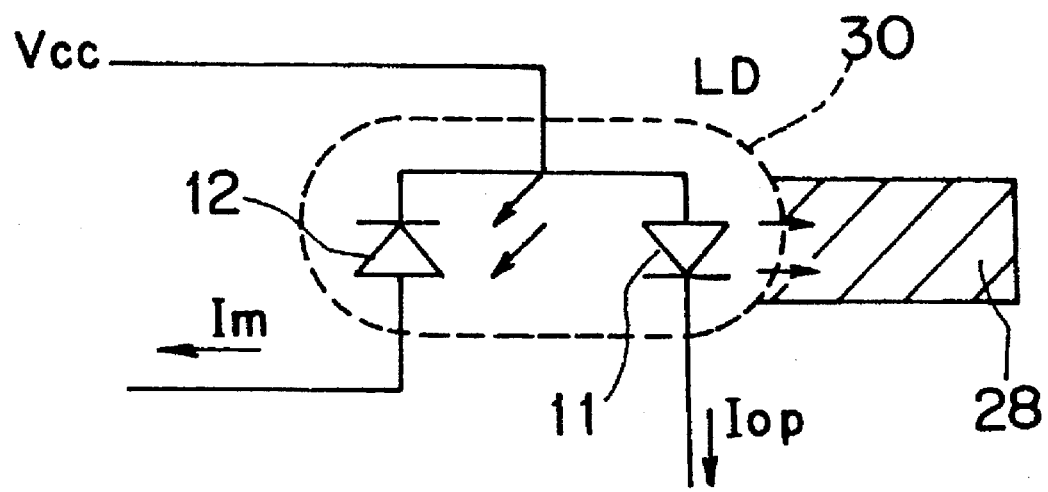
FIG. 28 is a model diagram showing a heat sink mounted on a laser diode chip in a semiconductor laser control device.

Then when the analog switch 24 is turned on, the voltage Vm from the operational amplifier 38 is directly supplied to the variable resistor 25, as shown with the voltage division ratio K on the left side in FIG. 20. Therefore the range of the voltage division ratio K to the current Im is similar to that of the related art shown in FIG. 27.

As shown with the voltage division ratio K on the right side in FIG. 20, when the analog switch 24 is turned off, the voltage Vm from the operational amplifier 38 is supplied to the resistor 25 via the resistor 54. Hence the range of the voltage division ratio K to the current Im is widened in accordance with the resistance value of the resistor 59. In other words, since the resistor 59 can drop previously the voltage divided by the variable resistor 25, the voltage division ratio K to the rotational angle of the resistance adjusting knob can be widened.

In the similar manner to that of the prior art, each value in the figure has the relations including current Im=light amount P0×light amount P5/5 mW, voltage Vm=current Im×resistance value of resistance 61, and K=reference voltage Vref/voltage Vm.

As a result, as shown by the light amount of 2 mW to 4 mW in the figure, since the range of the voltage division ratio K to the current Im can be widened, the current can be adjusted without using a special device even if the current Im becomes large. Such an effect can be obtained by adding merely a small device to the semiconductor laser control device, thus being superior in a manufacturing cost.

A variable resistor may be used instead of the resistor 59. In this case, the voltage division ratio K can be adjusted continuously and purposely. The maximum resistance value of the resistor is set so as not to emit excessively the laser diode 11 even if the analog switch 24 is turned on or off when the resistor 25 is adjusted to its minimum resistance value and the current Im is at a minimum value.

(j) Explanation of the Ninth Embodiment

Figure 21:
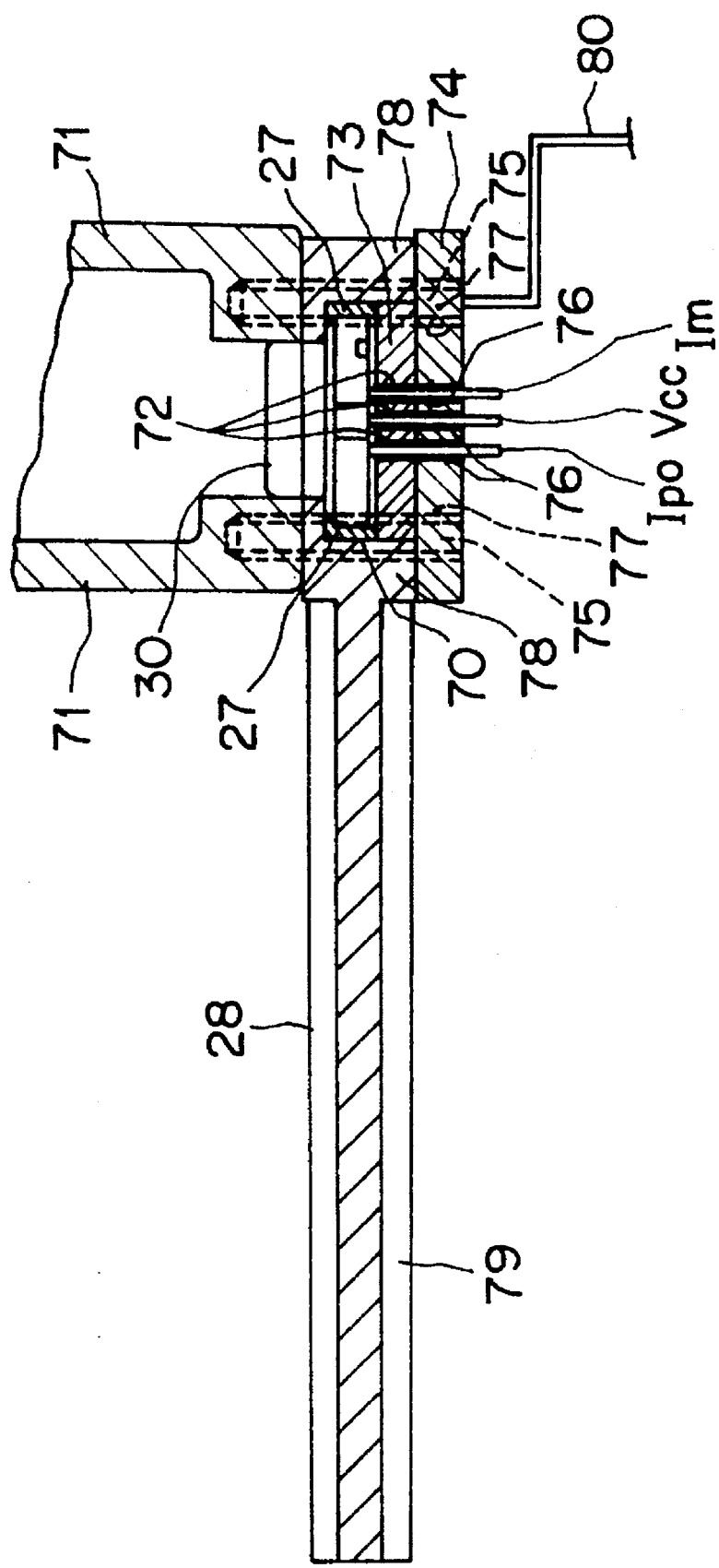
FIG. 21 is a cross sectional view showing a heat sink mounted on a laser diode chip.
Figure 22:
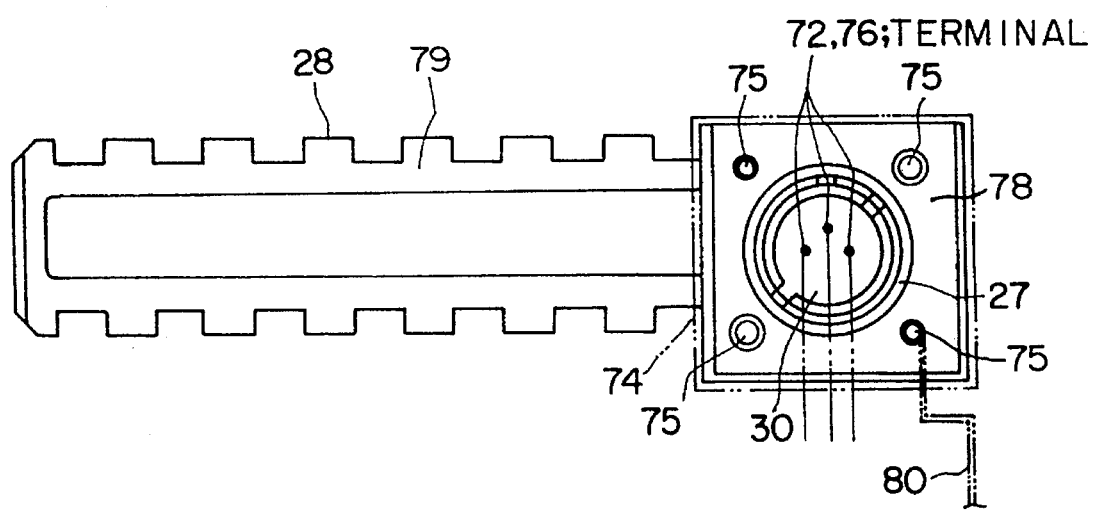
FIG. 22 is a diagram showing a heat sink mounted on a laser diode chip.
Figure 23:
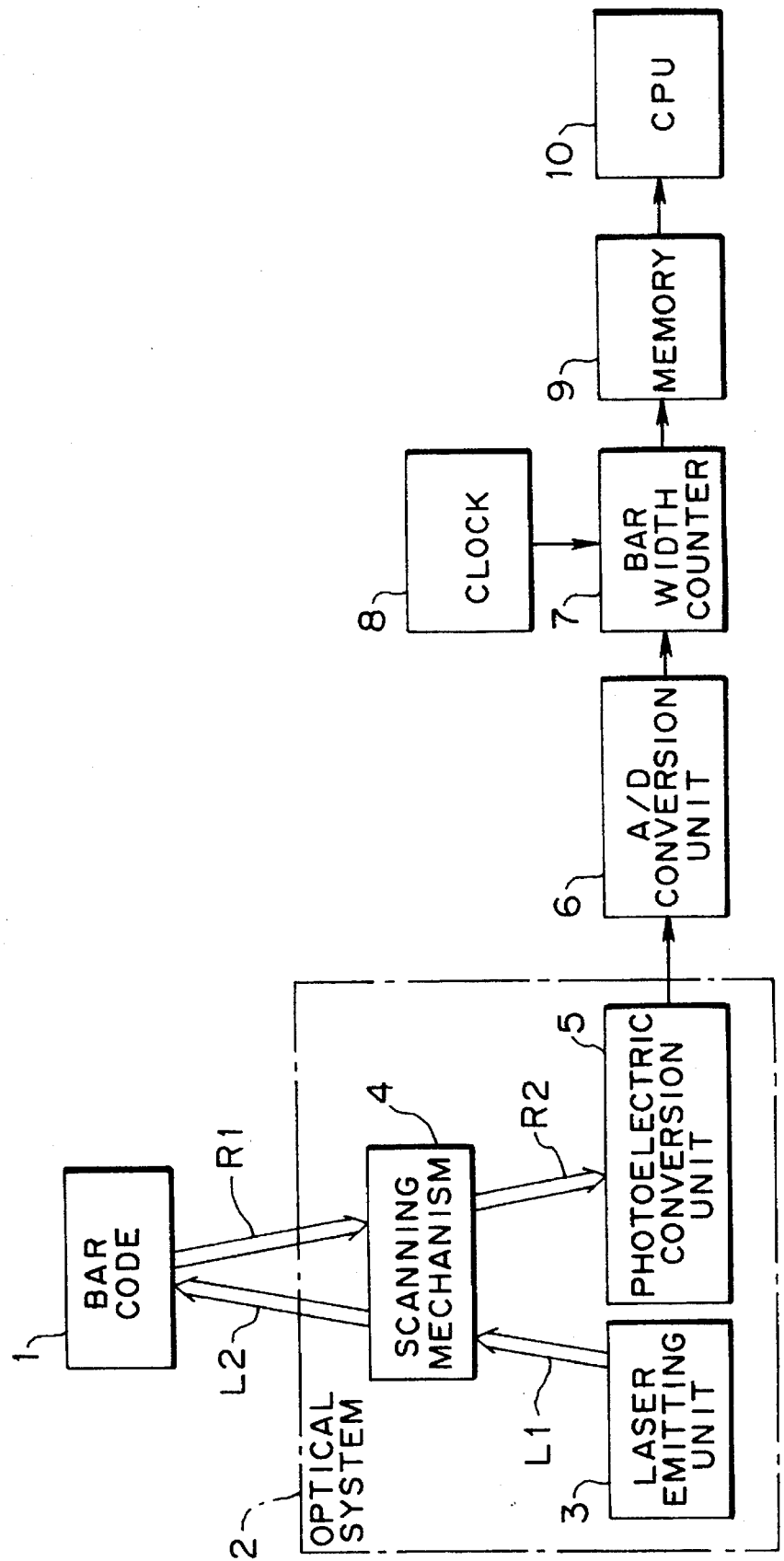
FIG. 23 is a circuit block diagram showing a bar code reading device.
Figure 24:
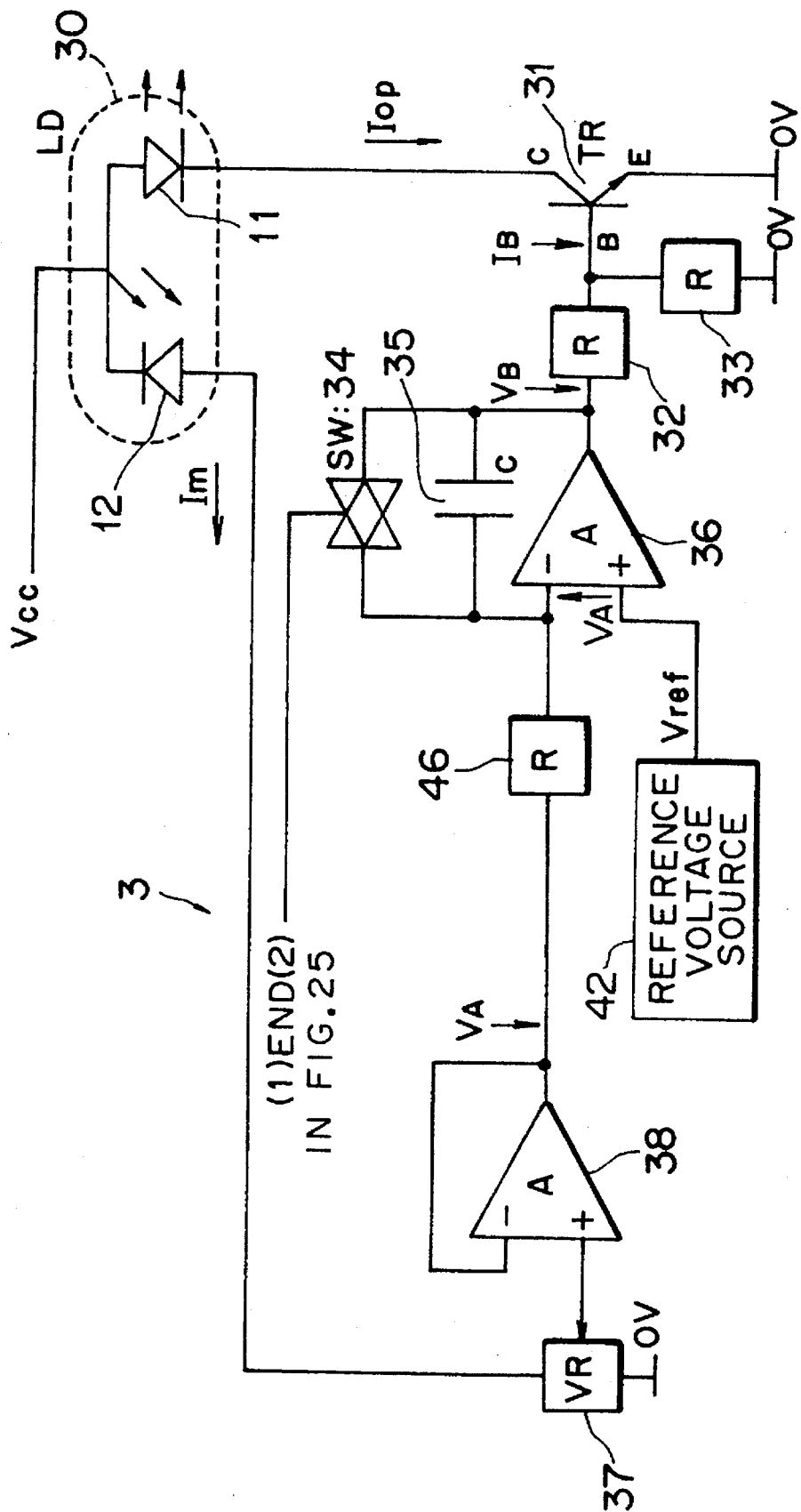
FIG. 24 is a circuit block diagram showing a semiconductor laser control device.

FIG. 21 is a cross sectional view showing an LD chip mounted on a heat sink according to the ninth embodiment of the present invention. FIG. 22 is a diagram viewed from the terminal side of the LD chip removed from the printed board 74. In FIGS. 21 and 22, the LD chip 30 is used in the semiconductor laser control device, as described in the foregoing embodiments.

The LD chip 30 is contained in the container 70 formed of the case 71 and the heat sink (heat dissipating member) 28. The LD chip 30 is contacted with the heat sink 28 via the plastic intermediate member 27. The heat sink 28 is formed of a member 78 conducting heat generated in the LD chip 30, and a heat dissipating surface 79 for dissipating heat sent from the heat conducting member 78. The heat conducting member 78 and the heat dissipating member 79 are made of a non-conductive material of a high transfer rate such as aluminum. The plastic member 27 is made of a non-conductive material having a thickness equivalent to the thermally contacted member.

The LD chip 30, as shown in FIG. 9, includes a laser diode 11 and an external photo diode 12 and has three pins for connecting electrically to the devices.

The LD chip 30 is fixed by inserting the three pins in the printed board 72 through corresponding three holes of cover member 73. The printed board 74 is fixed to the case 71 together with the heat sink 28 with four screws 75 in the recesses 77. The three terminals of the LD chip 30 are inserted to the cover member 73 through the corresponding holes 76. The screws 75 are made of an electrical conducting material such as metal. The screws 75 penetrate the heat conducting member 78 of the heat sink 28 so as to contact electrically with the case 71. One of the screws 75 is connected to the ground line 80. The recesses 77 are formed through the printed board 74, the heat conducting portion 78 of the heat sink 28, and the case 71. In FIG. 22, the chain line shows an example including printed board 74 and a pattern printed thereon.

According to the above structure, heat generated in the LD chip 30 is conducted to the conducting member 78 of the heat sink 28 via the plastic member 27 to dissipate externally from the heat dissipating surface 79. As a result, the laser diode 11 and the external photo diode 12 in the LD chip 30 can be prolonged in the operational life.

If the heat dissipating surface 79 receives external electromagnetic waves and electrostatic noises on the effect of an antenna, the noises are not transmitted to the LD chip 30 because the plastic intermediate member 27 shields them. As a result, the heat sink 28 is held at a fixed potential different from that of the LD chip 30.

The current generated in the heat sink 28 due to noises flows from the screw 75 contacted to the ground line 80 through the conduction member 78 of the heat sink 28. Thus an undesired current flowing to the laser diode 11 and the external photo diode 12 in the LD chip 30 are prevented and the diodes can be prolonged in its operational life. As a result, the laser diode 11 and the external photo diode 12 has a strong immunity to noises so that the semiconductor laser control device can improve its stability and accuracy. The replacement of the diode is not nearly needed and accordingly the device becomes very economical. The similar effect can be obtained by using an intermediate member such as glass or silicon, in place of the plastic intermediate member 27.

What is claimed is:

1. A semiconductor control method wherein a light amount current controllable semiconductor laser is subjected to a feedback control based on a predetermined constant while said semiconductor laser is monitored, comprising the steps of:

subjecting the light amount of said semiconductor laser to a feedback control based on a first time constant when a light amount of said semiconductor laser is less than a predetermined light amount; and subjecting the light amount of said semiconductor laser to a feedback control based on a second time constant when a light amount of said semiconductor laser is more than said predetermined light amount.

2. A semiconductor laser control method according to claim 1, wherein said second time constant is set to be longer than said first time constant.

3. A semiconductor laser control device comprising:

a semiconductor laser permitting a light-amount control in accordance with current;

light amount monitoring means for monitoring a light amount of said semiconductor laser;

first feedback control means for controlling a feedback of said light amount from said semiconductor laser with a first time constant based on a monitoring result from said light monitoring means;

second feedback control means for controlling a feedback of said light amount of said semiconductor laser with a second time constant based on a monitoring result from said light amount monitoring means; and control mode selecting means for selecting a control mode by said first feedback control means when a monitoring result of said light amount monitoring means is less than a predetermined light amount and for selecting a control mode by said second control feedback means when said monitoring result is more than said predetermined light amount.

4. A semiconductor laser control device according to claim 3, wherein said second time constant is set to be longer than said first time constant.

5. A semiconductor laser control method wherein a light amount current controllable semiconductor laser is subjected to a light amount feedback control with a predetermined time constant while said light amount is monitored, comprising the steps of:

controlling a feedback of a light amount of said semiconductor laser with a first time constant after a predetermined lapse of time when said semiconductor laser has been changed from an off state to an on state; and controlling a feedback of a light amount of said semiconductor laser with a second time constant after said predetermined lapse of time has expired.

6. A semiconductor laser control method according to claim 5, wherein said second time constant is set to be longer than said first time constant.

7. A semiconductor laser control method according to claim 5, wherein said predetermined time is set to be longer than a period of time when said semiconductor laser emits said predetermined light amount value defined by said first time constant.

8. A semiconductor laser control device comprising:

a semiconductor laser permitting a light-amount control in accordance with current; light amount monitoring means for monitoring a light amount of said semiconductor laser;

first feedback control means for controlling a feedback of light amount from said semiconductor laser with a first time constant based on a monitoring result from said light amount monitoring means;

second feedback control means for controlling a feedback of said light amount of said semiconductor laser with a second time constant based on a monitoring result from said light amount monitoring means;

on/off control means for controlling the on/off operation of said semiconductor laser; and control mode selecting means for selecting a control mode of said first feedback control means after a predetermined period of time when said semiconductor laser has been changed from an off state to an on state by said on/off control means, and for controlling a control mode of said second feedback control means after said predetermined period of time has expired.

9. A semiconductor laser control device according to claim 8, wherein said second time constant is set to be longer than said first time constant.

10. A semiconductor laser control device according to claim 8, wherein said predetermined time is set to be longer than a period of time till the light amount of said semiconductor laser reaches a predetermined value based on said first time constant.

11. A semiconductor laser control method wherein a light amount of a light amount to current controllable semiconductor laser is subjected to a feedback control based on a predetermined time constant while said semiconductor laser is monitored, comprising the steps of:

controlling a feedback of light amount of said semiconductor laser with a first time constant when a drive current of said semiconductor laser is less than a predetermined drive current; and controlling a feedback of light amount of said semiconductor laser with a second time constant when a drive current of said semiconductor laser is more than said predetermined drive current.

12. A semiconductor laser control method according to claim 11, wherein said second time constant is set to longer than said first time constant.

13. A semiconductor laser control device comprising:

a semiconductor laser permitting a light-amount control in accordance with current;

light amount monitoring means for monitoring a light amount of said semiconductor laser;

drive current measuring means for measuring a drive current of said semiconductor laser;

first feedback control means for controlling a feedback of said light amount of said semiconductor laser with a first time constant based on a monitoring result from said light monitoring means;

second feedback control means for controlling a feedback of said light amount of said semiconductor laser with a second time constant based on a monitoring result of said light amount monitoring means; and control mode selecting means for selecting a control mode of said first feedback control means when a measuring result from said drive current measuring means is less than a predetermined drive current, and for controlling a control mode of said second feedback control means when the monitoring result from said drive current measuring means is more than said predetermined drive current.

14. A semiconductor laser control device according to claim 13, wherein said second time constant is set so as to be longer than said first time constant.

15. A semiconductor laser control method wherein a light amount of a light amount to current controllable semiconductor laser is subjected to a feedback control based on a predetermined constant while said semiconductor laser is monitored, comprising the steps of:

controlling a feedback of said light amount of said semiconductor laser based on a first time constant when a drive current of said semiconductor laser is less than a predetermined value;

controlling a feedback of light amount of said semiconductor laser based on a second time constant when a drive current of said semiconductor laser is more than said predetermined value; and controlling a feedback of said light amount of said semiconductor laser based on a third time constant when a light amount of said semiconductor laser is more than a predetermined light amount.

16. A semiconductor laser control method according to claim 15, wherein said third time constant is longer than said second time constant, and wherein said second time constant is longer than the first time constant.

17. A semiconductor laser control device comprising:

a semiconductor laser permitting a light-amount control in accordance with current;

light amount monitoring means for monitoring a light amount of said semiconductor laser;

drive current measuring means for measuring a drive current of said semiconductor laser;

first feedback control means for controlling a feedback of said light amount of said semiconductor laser with a first time constant based on a monitoring result from said light monitoring means;

second feedback control means for controlling a feedback of light amount of said semiconductor laser with a second time constant based on a monitoring result from said light amount monitoring means;

third feedback control means for controlling a feedback of said light amount of said semiconductor laser with a third control time constant based on a monitoring result from said light amount monitoring means; and control mode selecting means for selecting a control mode of said first feedback control means when a drive current is less than a predetermined value based on a measuring result of said drive current measuring means and said light amount monitoring means, for selecting a control mode of said second feedback control means when a drive current is more than a predetermined value, and for selecting a control mode of said third feedback control means when a light amount is more than a predetermined value.

18. A semiconductor laser control device according to claim 17, wherein said third time constant is longer than said second time constant, and wherein said second time constant is longer than said first time constant.

19. A semiconductor laser control device according to claim 1, further comprising a heat dissipating member of a conductive material mounted on said semiconductor laser for dissipating said semiconductor laser through an intermediate member of a non-conductive material having a thickness equivalent to that of a thermally contacted member.

20. A semiconductor laser control device according to claim 19, wherein said heat dissipating member is grounded.

21. A semiconductor laser control device according to claim 1, wherein a heat dissipating member of a conductive material is mounted on said semiconductor laser for dissipating said semiconductor laser via an intermediate member of a non-conductive material, said intermediate member having a thickness equivalent to that of a thermally contacted member.

22. A semiconductor laser control device according to claim 21, wherein said heat dissipating member is grounded.

23. A semiconductor control method for controlling a light amount current controllable semiconductor laser, comprising the steps of:

subjecting a light amount of said semiconductor laser to a feedback control based on a first time constant when the light amount of said semiconductor laser is less than a predetermined light amount; and subjecting a light amount of said semiconductor laser to a feedback control based on a second time constant when a light amount of said semiconductor laser is more than said predetermined light amount.

24. The semiconductor laser control method for controlling a light amount current control semiconductor laser comprising the steps of:

controlling a feedback of a light amount of said semiconductor laser with a first time constant after a predetermined lapse of time; and controlling a feedback of a light amount of said semiconductor laser with a second time constant after said predetermined lapse of time has expired.

25. A semiconductor laser control device according to claim 3, wherein a heat dissipating member of a conductive material is mounted on said semiconductor laser for dissipating said semiconductor laser via an intermediate member of a nonconductive material, said intermediate member having a thickness equivalent to that of a thermally contacted member.

* * * * *

UNITED STATES PATENT AND TRADEMARK OFFICE
CERTIFICATE OF CORRECTION

PATENT NO. : 5,511,087
DATED : April 23, 1996
INVENTOR(S) : Shinichi SATO, et al.

It is certified that error appears in the above-indentified patent and that said Letters Patent is hereby corrected as shown below:

```
Column 1, line 53, change "a" (first occurrence) to --a--; and
          line 65, change "b" to --b--.
Column 2, line 4, change "b" to --b--;
          line 5, change "c" to --c--; and
          line 28, change "c" to --c--.
Column 3, line 27, change "aid" to --a/d--.
Column 4, line 40, after "resistar." start new paragraph with --A--
Column 20, line 43, change "b" to --b--; and
           line 45, change "b" to --b--.
Column 22, line 19, change "a" to --a-- and change "b" to --b--;
           line 20, change "b" to --b-- and change "c" to --c--;
           line 21, change "c" to --c--;
           line 23, change "b" to --b--;
           line 36, change "b" to --b--;
           line 53, change "b" to --b--;
           line 55, change "b" to --b--;
           line 58, change "b" to --b--; and
           line 64, change "b" to --b-- and change "c" to --c--.
Column 23, line 8, change "b" to --b-- and change "c" to --c--;
           line 14, change "c" to --c--;
           line 18, change "c" to --c--; and
           line 29, change "d" to --d--.
```

UNITED STATES PATENT AND TRADEMARK OFFICE
CERTIFICATE OF CORRECTION

PATENT NO. : 5,511,087
DATED : April 23, 1996
INVENTOR(S) : Shinichi SATO, et al.

It is certified that error appears in the above-indentified patent and that said Letters Patent is hereby corrected as shown below:

```
Column 24, line 29, change "c" to --c--;
          line 30, change "c" to --c--;
          line 38, change "c" to --c--;
          line 44  change "c" to --c--;
          line 49, change "a" to --a-- and change "c" to --c--;
          line 53, change "q" to --q--;
          line 54, change "c" to --c--; and
          line 63, change "c" to --c--.
Column 25, line 9, change "c" to --c--.
Column 26, line 21, change "f" to --f--;
          line 25, change "139" to --39--;
          line 26, change "f" to --f--;
          line 31, change "b" to --b--; and
          line 36, change "e" to --e--.
Column 28, line 6, change "f" to --f--;
          line 16, change "b" to --b--;
          line 17, change "c" to --c--;
          line 28, change "c" to --c--; and
          line 34, change "g" to --g--.
Column 30, line 8, change "s" to --s--; and
          line 48, change "u" to --u--,
```

Signed and Sealed this

Sixth Day of August, 1996

Attest:

BRUCE LEHMAN

Attesting Officer         Commissioner of Patents and Trademarks